United States Patent [19]

Asai et al.

[11] 4,438,559

[45] Mar. 27, 1984

[54] APPARATUS FOR AUTOMATICALLY MOUNTING NON-LEAD ELECTRONIC COMPONENTS ON PRINTED-CIRCUIT

[75] Inventors: Koichi Asai, Nagoya; Kunio Oe, Chiryu; Mamoru Tuda, Okazaki, all of Japan

[73] Assignee: Fuji Machine Mfg. Co. Ltd., Chiryu, Japan

[21] Appl. No.: 277,105

[22] Filed: Jun. 25, 1981

[30] Foreign Application Priority Data

| Jun. 27, 1980 [JP] | Japan | 55-88326 |
| Aug. 6, 1980 [JP] | Japan | 55-108613 |
| Aug. 9, 1980 [JP] | Japan | 55-109587 |
| Aug. 20, 1980 [JP] | Japan | 55-114274 |

[51] Int. Cl.³ ............................................ B23P 19/00
[52] U.S. Cl. ...................................... 29/740; 29/840
[58] Field of Search .................... 29/564.6, 740, 741, 29/739, 840; 228/5.1, 6 A

[56] References Cited

U.S. PATENT DOCUMENTS

| 3,597,824 | 8/1971 | Yoshida et al. | 29/564.6 X |
| 4,054,988 | 10/1977 | Masuzima et al. | 29/564.6 |
| 4,166,562 | 9/1979 | Keizer et al. | 29/741 X |
| 4,307,832 | 12/1981 | Taki et al. | 228/5.1 |
| 4,327,482 | 5/1982 | Araki et al. | 29/740 |
| 4,346,514 | 8/1982 | Makizawa et al. | |

FOREIGN PATENT DOCUMENTS 46334  2/1982  European Pat. Off. .............. 29/740

Primary Examiner—Howard N. Goldberg
Assistant Examiner—Carl J. Arbes
Attorney, Agent, or Firm—Browdy and Neimark

[57] ABSTRACT

A method and an apparatus for automatically mounting, on printed circuit boards, non-lead electronic components which are stored mutually independently within a multiplicity of apertures equally spaced longitudinally in a strip member and is covered with a covering tape. The covering tape is separated first by a covering tape separating assembly from the strip member so as to uncover a leading one of the apertures. A leading portion of the strip member including the uncovered leading aperture is cut off the strip member by a severing assembly consecutively. A plurality of the leading portions cut off the strip members respectively storing different kinds of components are arranged on a transfer element of a transfer assembly in a desired order and transferred to a fixed position by the transfer member. Each component stored in the cut-off leading portions is picked up, transferred, and mounted on a printed circuit board one by one. The uncovered and cut-off leading portion is utilized as a part of the transfer assembly.

10 Claims, 35 Drawing Figures

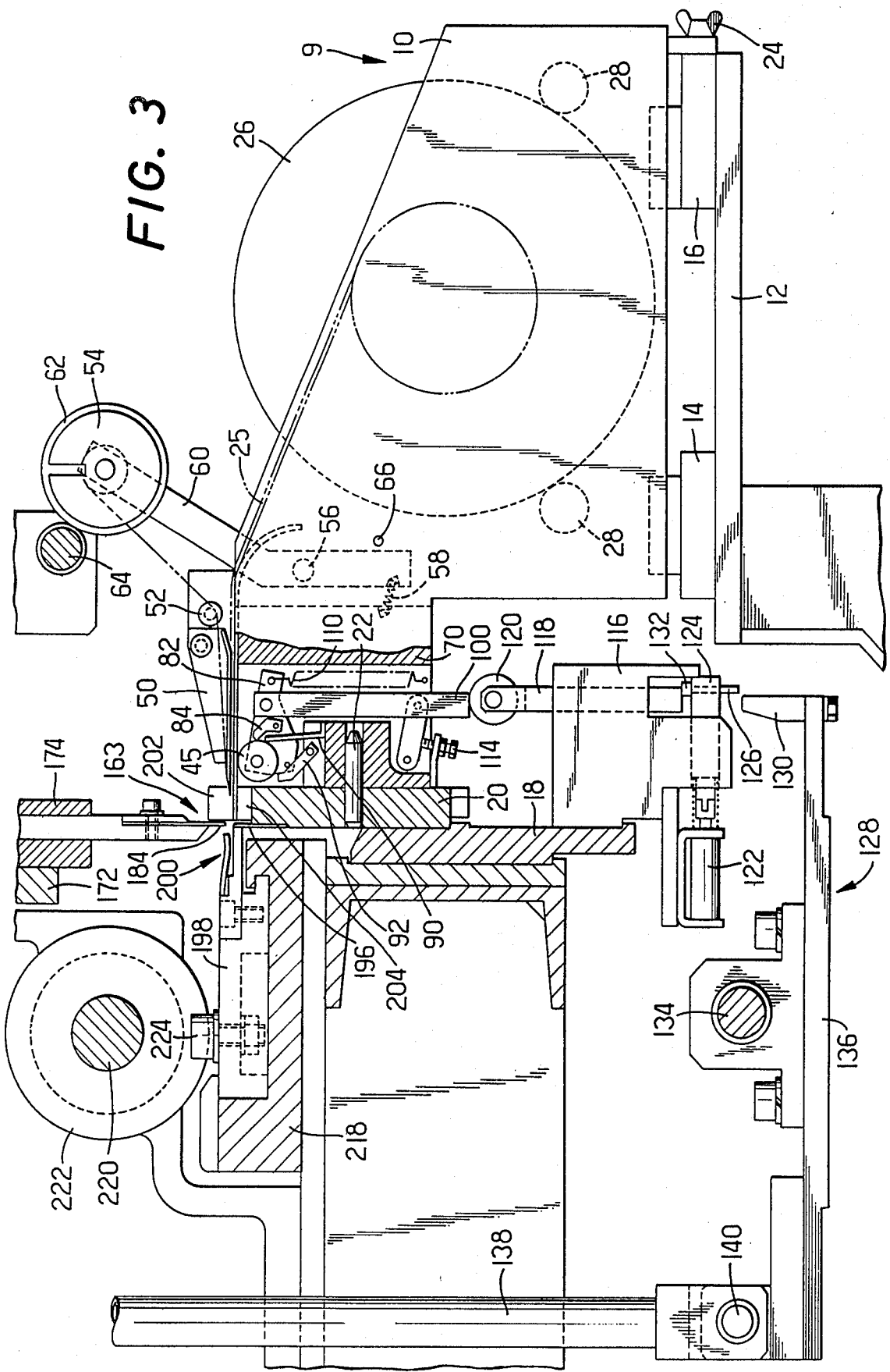

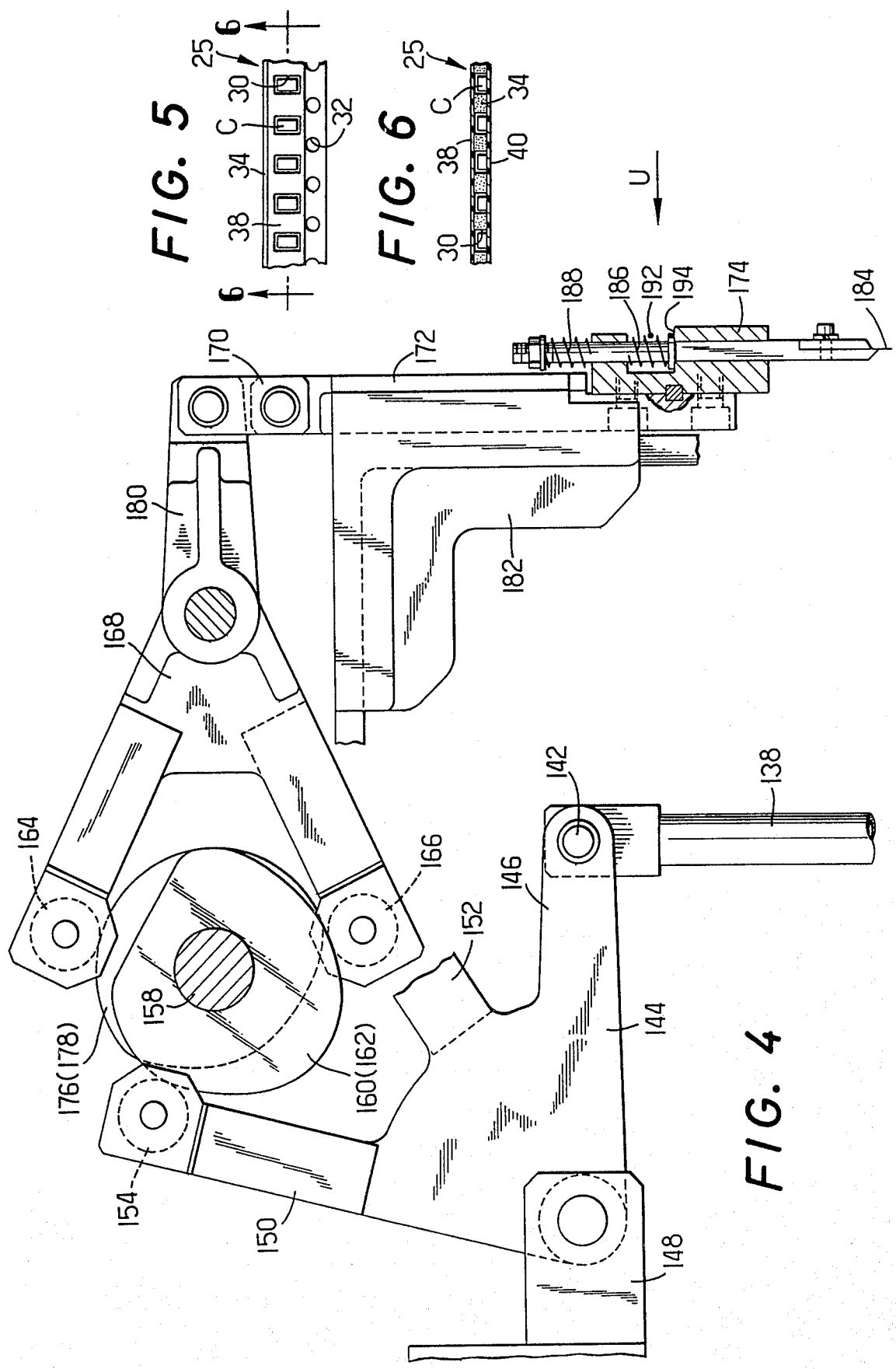

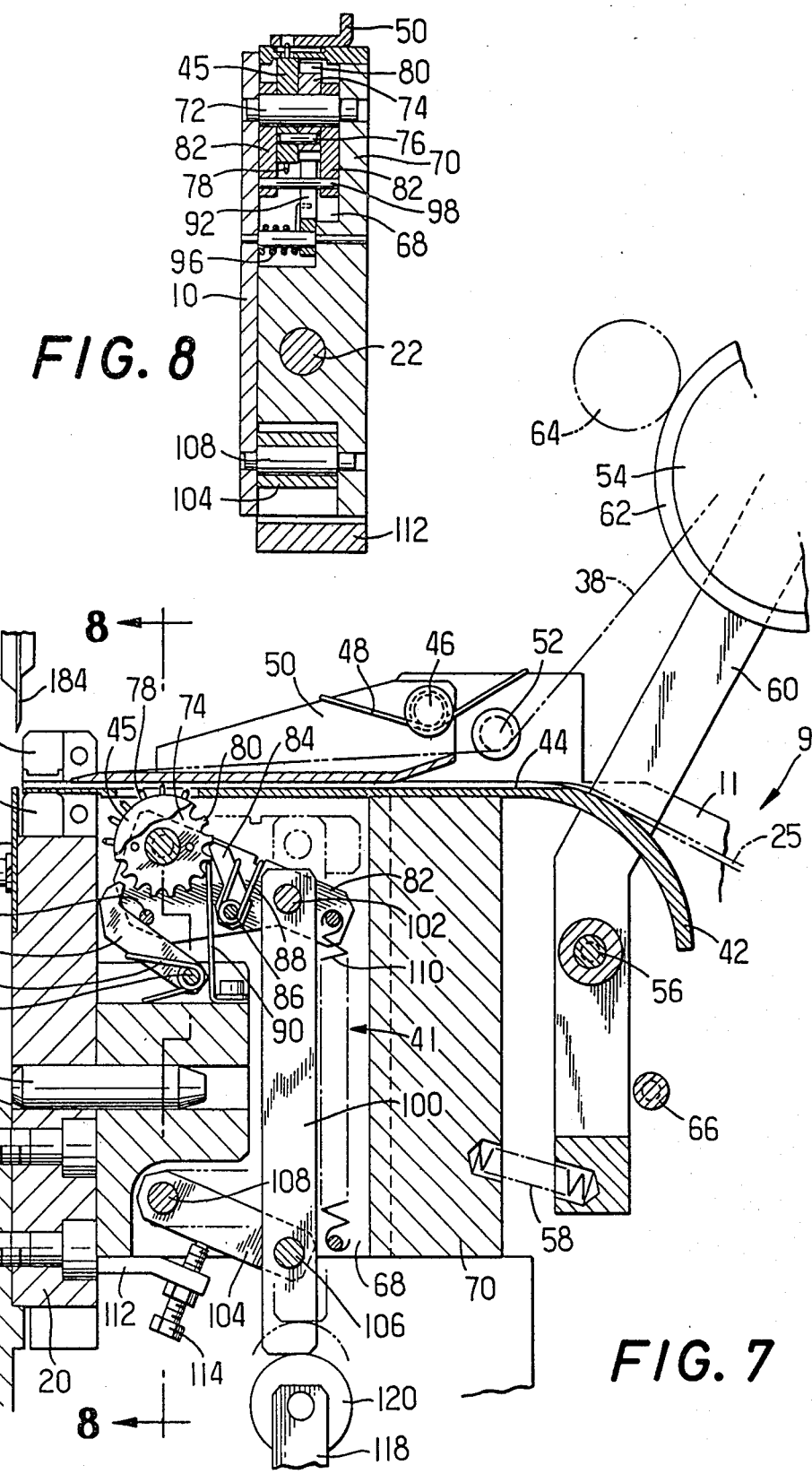

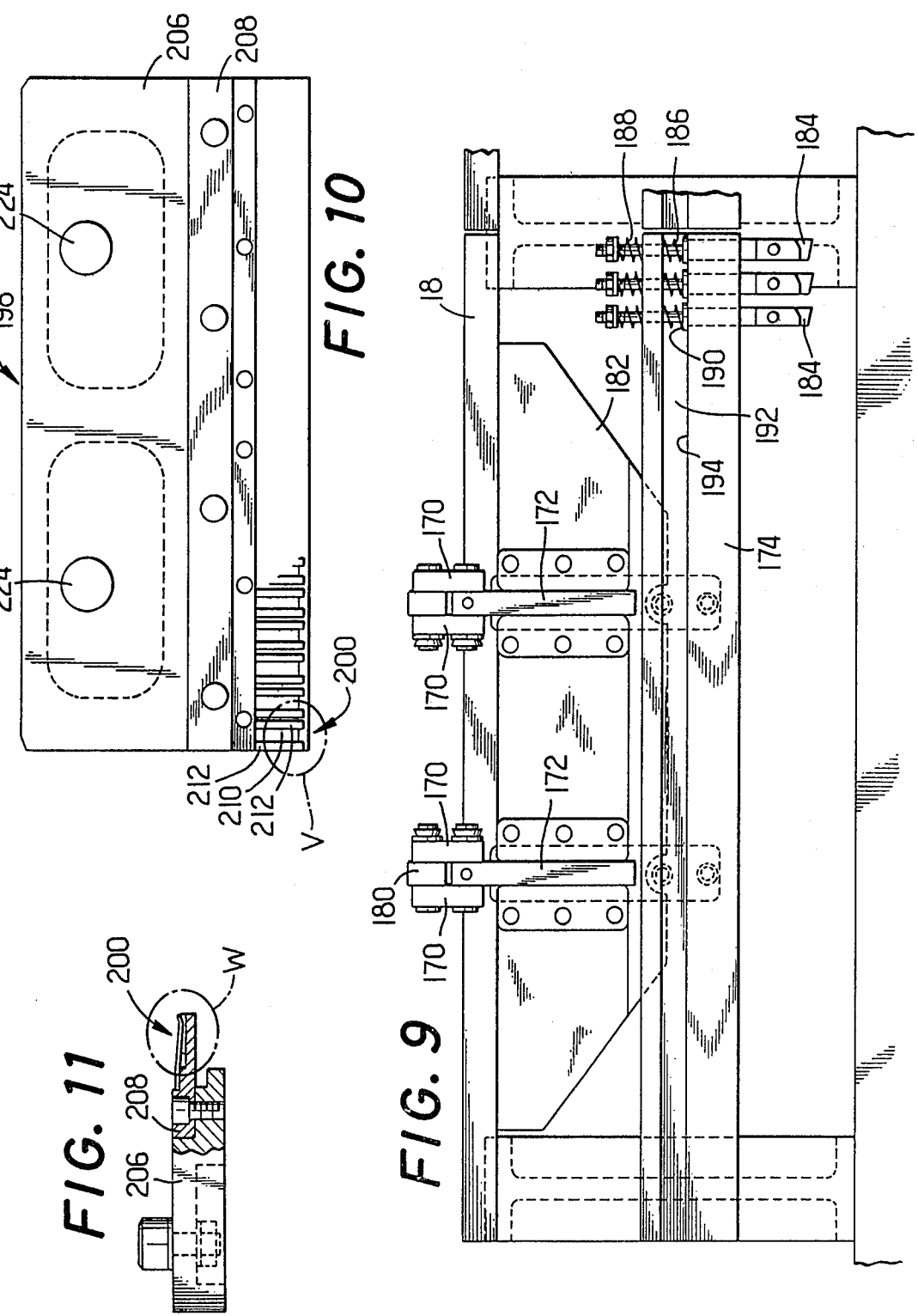

APPARATUS FOR AUTOMATICALLY MOUNTING NON-LEAD ELECTRONIC COMPONENTS ON PRINTED-CIRCUIT

FIELD OF THE INVENTION

The present invention relates generally to the art of automatically mounting on printed-circuit boards or other similar workpieces, electronic components in the form of chips having no lead wires. In particular, the invention is concerned with method and apparatus for automatically taking out the non-lead electronic components from a carrying tape which includes a strip member having longitudinally, equally spaced apertures in which electronic components are mutually independently stored and which are covered with an upper covering tape disposed over the strip member, and subsequently mounting automatically the components on the workpieces such as the printed-circuit boards.

BACKGROUND OF THE INVENTION

Component carrying tapes as introduced above have in recent years been used in automatic mounting of non-lead electronic components on workpieces like printed-circuit boards on which electronic circuits are formed. Since commonly applicable electronic components are extremely small in size, however, it has not been easy to take such components out of a carrying tape and accurately position the same on the workpiece. In addition, it has been far more difficult to mixedly mount on the same workpiece various types of non-lead components of different configurations and sizes. Thus, there have not been available any method and apparatus which are sufficiently capable of overcoming such problems, and therefore method and apparatus of such capability have long been expected to be developed.

SUMMARY OF THE INVENTION

It is therefore a primary object of this invention to provide a method and an apparatus for mixedly mounting on a workpiece various types of non-lead components of different configurations and size by easy handling of the components.

This invention, which was made for the purpose of achieving the above object is found successfully operative in overcoming the difficulties conventionally encountered in transferring the non-lead components. According to the invention, the covering tape is separated from the component carrying tape which is subsequently cut into unit carrying tapes each storing therein one component. Such unit carrying tapes are transferred to eventually transfer the components stored therein, i.e., by utilizing those unit carrying tapes as a part of an electronic component transfer apparatus.

The features of the component mounting method in accordance with this invention resides in the inclusion of the following steps:
 (1) feeding in an intermittent manner a carrying tape with a covering tape thereof facing up, the carrying tape including a strip member which has a multiplicity of longitudinally formed, equally spaced apertures wherein non-lead electronic components are mutually independently stored, the apertures being covered with the covering tape, and the distance of each feeding movement of the carrying tape being equal to a spacing of the apertures;
 (2) separating the covering tape from the intermittently fed carrying tape to uncover the apertures;
 (3) holding, with a gripper portion of a transfer member of a mounting apparatus, a leading portion of the carrying tape which includes a leading aperture uncovered in the previous separating step, and subsequently severing the carrying tape between the uncovered leading aperture and the following aperture to make a unit carrying tape;
 (4) transferring the severed unit carrying tape held with the transfer member by moving the latter to a desired position on the mounting apparatus; and
 (5) picking up, with a pick-up member of a loading assembly of the mounting apparatus, an electronic component stored in the uncovered aperture in the unit carrying tape which has been transferred to the above desired position, them moving the electronic component to a specified position on the electronic circuit forming printed-circuit boards or other similar workpieces, and mounting the same at the specified position on the workpiece.

The method according to the invention including the above steps, makes it possible to attain mutually independent transfer of small-sized, and consequently hard-to-handle, non-lead electronic components up to the loading assembly of the mounting apparatus, yet without any part of any transfer assembly members directly touching those components which are often made of ceramic or other materials that may cause the transfer assembly members to be easily worn out if otherwise subjected to direct touch with the components. The fact that the electronic components are supplied to the transfer assembly while being contained within respective unit carrying tapes, also makes it possible to handle a wide variety of components of different shapes and dimensions under the same conditions. On the contrary, it is comparatively easy to form the apertures in the component carrying tape to such shape and size that permit sufficiently exact positioning of the components in the storage apertures. Hence, the electronic components may be exactly positioned on the mounting apparatus through accurate positioning of the respective unit carrying tapes, and no difficulty is encountered in transferring the components from the transfer member to a sucker member of the apparatus.

An apparatus in accordance with this invention, which is suitable for carrying out the above method, comprises:
 (1) a supply assembly including a plurality of equally spaced tape cartridges which accommodate a corresponding number of electronic component carrying tapes to store and supply different types of electronic components having no leads, each of the carrying tapes including a strip member which has a multiplicity of longitudinally formed apertures in which a respective single type of the electronic components are mutually independently stored and which are covered with a covering tape disposed over the strip member;
 (2) a transfer assembly equipped with a transfer member having a plurality of grippers disposed along either one of a straight and a curved lines, and with drive means to move in an intermittent manner said transfer member along component supply portions of the plurality of tape cartridges, the distance of each movement of the transfer member being equal to a spacing of the component supply portions;

(3) tape feed assemblies provided corresponding to the plurality of tape cartridges, each of the tape feed assemblies being activated when one of the grippers to hold the carrying tape accommodated in one of the plurality of tape cartridges is stopped into alignment with one of the component supply portions of the said one of plurality of tape cartridges, for feeding in an intermittent manner the carrying tape with the covering tape facing up, the distance of each feeding movement of the carrying tape being equal to a spacing of the multiplicity of apertures;

(4) covering tape separating assemblies, provided corresponding to the plurality of tape cartridges, for separating the covering tape from the carrying tape which has been fed by the distance equal to the spacing of the apertures, and thereby uncovering a leading one of the multiplicity of apertures;

(5) carrying tape severing assemblies, disposed between each of the component supply portions of the tape cartridges and the grippers, for cutting off a leading portion of the carrying tape which includes the uncovered leading aperture and from which the covering tape has been separated, while holding the same with the grippers, the cut-off leading portion constituting a unit carrying tape;

(6) a loading assembly, equipped with a sucker member to suck up through vacuum the electronic component, for picking up with the sucker member the component from the uncovered aperture in the cut-off unit carrying tape which has been transferred to a specified position, and mounting the component on the workpiece; and (7) a positioning assembly for establishing desired relative positions between the sucker member and the workpiece.

This apparatus according to the invention may not only enjoy the features of the mounting method of the same invention but also offer its own advantages of reduced mounting cycle time and improved mounting efficiency, which advantages are derived from the facts that the different types of non-lead electronic components are held with the grippers provided in the transfer member in the order of mounting the same on an electronic circuit forming workpiece by means of the loading assembly, whereby the different types of components may be loaded by the loading assembly onto the workpiece in the order in which the components have been transferred to the loading assembly by the transfer assembly.

BRIEF DESCRIPTION OF THE DRAWING

FIG. 3 is a view (partially in cross section) taken in the direction of the arrow T of FIG. 2A, and FIG. 4 is a view taken along the line 4—4 of FIG. 1A;

FIG. 5 is a plan view of a tape used on the apparatus of FIGS. 1 and 2, and FIG. 6 is a cross sectional view taken along the line 6—6 of FIG. 5;

FIG. 7 is an enlarged view of an essential part of the apparatus illustrated in FIG. 3, and FIG. 8 is a cross sectional view taken along the line 8—8 of FIG. 7;

FIG. 9 is a view taken in the direction of the arrow U of FIG. 4;

FIG. 10 is a plan view of a pallet of the apparatus, FIG. 11 is a side view (partially in cross section) of the same.

DETAILED DESCRIPTION OF THE PREFERRED EMBODIMENT

Referring now to the attached drawings, there is illustrated an embodiment of this invention which is hereunder described in detail.

FIGS. 1A, 1B, 2A and 2B are schematic views of an apparatus embodying the present invention.

Electronic components C (hereinafter referred to as "chip") having no lead wires are supplied by a supply assembly 2, transferred to a loading assembly 6 by a transfer assembly 4, and mounted by the loading assembly 6 on a printed-circuit board which has been positioned by a positioning assembly 8.

Figure 31:
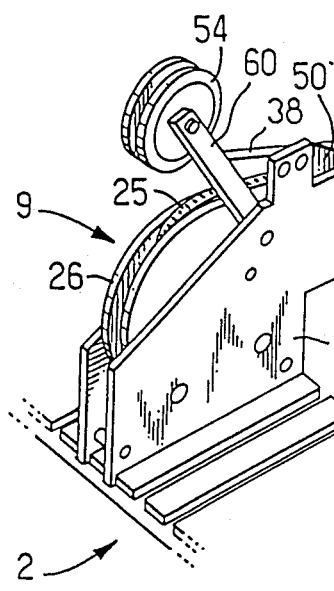
FIG. 31 is a perspective view illustrating a tape feed assembly most clearly shown in FIG. 7, a covering tape separating assembly most clearly shown in FIG. 3, and a tape severing assembly shown in FIGS. 3, 4 and 9.

The supply assembly 2 is equipped with a multiplicity of cartridges 9 as shown in FIGS. 3 and 31. Each of the cartridges 9, which comprises two mutually parallel side plate 10 and 11 (See FIG. 7 for the side plate 11.) connected to each other with a plurality of fasteners, is positioned by positioning blocks 14 and 16 disposed on a support member 12, and by a positioning pin 22 which is partly received in a face plate 20 fixed to a frame 18 of the apparatus of this invention, and the cartridge 9 is fixed to the positioning block 16 by a butterfly or wing nut 24. Such multiplicity of cartridges 9 are disposed on the support member 12 in parallel to each other, each accommodating a reel 26 which is loaded with a roll of tape 25, and rotatably supported by a pair of rollers 28.

The tape 25, as illustrated in FIGS. 5 and 6, consists of a thick, paper-made, strip member 34 having rectangular, electronic component storage holes 30 and circular, sprocket-engageable feed holes 32, both holes being equally spaced longitudinally of the strip member 34; a thin, transparent, lower backing tape 40 bottoming the rectangular storage holes 30 to make them bottomed apertures; and a similarly thin, transparent, upper covering tape 38 covering the bottomed apertures.

The tape 25 drawn from the tape reel 26 is fed intermittently by a tape feed assembly 41 shown enlarged in FIGS. 7 and 8, the distance of each feeding movement thereof being equal to a spacing of the rectangular holes 30 or the circular feed holes 32, i.e., the tape 25 is fed with a sprocket wheel 45 while being guided by a guiding channel 44 which is formed in a stationary guide 42 fixed to the cartridge 9. The tape 25 is prevented from being dislocated out of the guiding channel 44 by a tape retainer 50 which is pivotably connected to the cartridge 9 with a stepped screw 46 and biased toward the stationary guide 42 by a spring 48. As is most clearly shown in FIG. 31, the upper covering tape 38 is separated, at a position of the stationary guide 42 slightly ahead of the tape retainer 50, from the thick, paper-made, strip member 34, and wound on a take-up reel 54 through a guiding pin 52 while being turned over along the tip of said tape retainer 50. The take-up reel 54 is positioned above and at the rear of the tip of the tape retainer 50 and mounted on a lever 60 which is pivotally connected to the cartridge 9 with a pin 56 and biased by a spring 58 in the direction that causes the lever to pivot counterclockwise (as viewed in FIG. 7). The take-up reel 54 is provided, on its circumference, with a rubber ring 62 which engages a drive roll 64 to drive the reel 54 through friction. A stop pin 66 is provided to prevent the lever 60 from pivoting beyond a predetermined limit when the cartridge 9 is removed from the apparatus.

To an end portion of the side plate 11 of the cartridge 9, is fixed a block 70 which has an opening 68 to accommodate the sprocket wheel 45 and other parts. As most clearly shown in FIG. 8, the sprocket wheel 45 is fixed with a force- or press-fit method, together with a gear 74, to a shaft 72 which is rotatably supported by the block 70 and the side plate 10. The relative position between the sprocket wheel 45 and the gear 74 is maintained by a pin 76, and teeth 78 of the sprocket wheel 45 and teeth 80 of the gear 74 are provided at the same angular intervals. The sprocket wheel 45 and the gear 74 are sandwiched by two arms 82 which are pivotally mounted on the rotating shaft 72. As shown in FIG. 7, a feed pawl 84 is pivotally connected to these arms 82 with a pin 86, and biased by a spring 88 in the direction that causes it to engage the gear 74. Also attached to the block 70, are an anti-reverse member 90 and a detent pawl 92. The anti-reverse member 90, which is made of spring steel and bolted at its base portion to the block 70, is so designed that its free end portion is always in contact with the teeth of the gear 74 due to its own resiliency in order to allow the gear 74 to rotate in its forward direction but prevent the same from rotating in the reversed direction. While the detent pawl 92 is biased by a spring 96 in the direction that causes it to engage the gear 74, its engagement with the gear 74 is released, as shown in FIG. 7, by a pin 98 supported by and bridging the two arms 82, when the arms have pivoted downwardly beyond a predetermined angular position.

An upper portion of a rod 100 is interposed between a pair of the arms 82 which are pivotably connected thereto with a pin 102. A lower portion of the rod 100 is connected to the block 70 with a pair of links 104 and pins 106, 108. Thus, a quadric link mechanism is constituted by the block 70, arms 82, rod 100 and links 104 with the rod 100 reciprocating vertically. While the arms 82 are biased through tension of a spring 110 connected to one end portion of the arms 82 and the block 70 in the direction that causes them to pivot downwardly, the lower limit of their pivoting movement is regulated by a stop bolt 114 which is threaded in a bracket 112 fixed to the block 70.

As illustrated in FIG. 3, a block 116 is fixed to the frame 18 at a position below the face plate 20. There are vertically slidably received in this block 116 a multiplicity of rods 118 corresponding to the rods 100 of the above discussed multiplicity of cartridges 9. Each of the rods 118 is intended to push up the corresponding rod 100 through a roller 120 which is attached to an upper end of the rod 118. The block 116 also engages movable members 124 which are output members of solenoids 122, which members 124 are movable in a direction normal to the sliding direction of the rods 118. In each of the movable members 124 is received a relay pin 126 which is slidable therein longitudinally of the rod 118. The movable member 124 is designed so that a lower end of its relay pin 126 is normally located, as shown in FIG. 3, at a position out of alignment with a long, thin plate 130 disposed below the pin 126, which plate 130 is an output member of a driving device 128, and that the pin 126 is moved until its lower end is located at another position right above the plate 130 when the solenoid 122 is energized. In either one of the above positions, a head 132 of the relay pin 126 is held in contact with and thus supporting a lower end of the rod 118.

The driving device 128 is equipped with a pivoting plate 136 which holds the plate 130 at one end and is pivotally supported at its middle portion by a shaft 134. The other end of the pivoting plate 136 is connected, through a connecting rod 138 and pins 140 and 142, to an arm 146 of a lever 144 shown in FIG. 4. The lever 144 is pivotally supported by a bracket 148 fixed to the frame 18, and has two arms 150 and 152 other than the arm 146. Rollers 154, and 156 (not shown) are attached to the ends of the arms 150 and 152, respectively, as cam followers which are intended to follow contours of cams 160 and 162, fixed to a drive shaft 158, respectively. The drive shaft 158 is, as shown in FIG. 1B, rotated through a chain 161 by a motor 159 incorporating a reduction gear, at a fixed speed.

The drive shaft 158 also functions as a shaft to drive a severing assembly 163 which cuts the tape 25. As illustrated in detail in FIG. 4, the drive shaft 158 has cams 176 and 178 fixed thereto which serve to lift and lower a movable-blade holder 174 through rollers 164 and 166, a lever 168, links 170 and sliding members 172. An arm 180 of the lever 168 is forked at one end thereof as shown in FIG. 4, and the forked arm is connected to the sliding member 172 with the respective links 170 as shown in FIG. 9. These sliding members 172 are held vertically slidably by a bracket 182 fixed to the frame 18, and to a lower end portion of the sliding members is fixed the longitudinally-extending, movable-blade holder 174 which holds a multiplicity of movable blades 184 disposed corresponding to the multiplicity of cartridges 9. Each of the movable blades 184, which are shown in perspective, in FIGS. 31 and 32, is vertically slidable in the holder 174 but not rotatable about its axis, biased downwardly by springs 186 and 188 and normally held at a standstill with a ring 190 resting on an up-facing surface 194 of a groove 192 formed in the holder 174.

Figure 32:
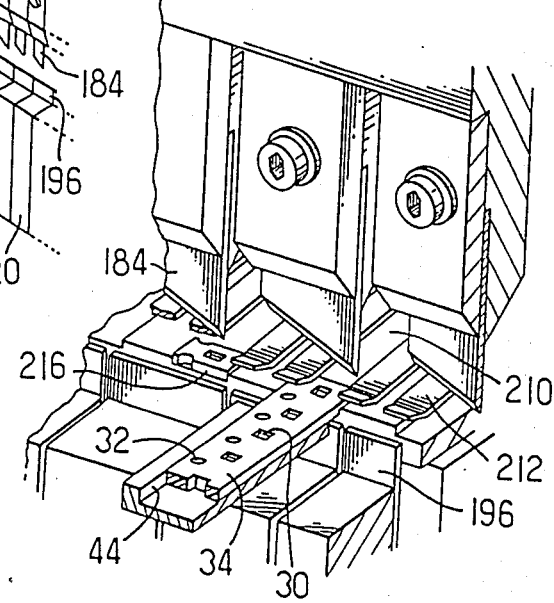
FIG. 32 is a perspective view illustrating in enlargement the tape severing assembly, and a leading end of the tape before it is severed.

Stationary blades 196 also shown in perspective in FIGS. 31 and 32 are fixed to the face plate 20 shown in FIG. 3 to cut the tape 25 (precisely, the tape 25 with its upper covering tape 38 separated therefrom) in cooperation with the respective movable blades 184 which are lowered while the leading portion of the tape 25 fed by the sprocket wheel 45 is held in a gripper 200 of a pallet 198 of a transfer assembly 4.

Adjacent to the stationary blade 196, there are also fixed to the face plate 20 light emitting and receiving elements 202 and 204 of a photoelectric detector as shown in FIG. 7. The detector monitors for presence of a chip C in the electronic component storage hole 30 in the tape 25 and if the chip C was not present in the hole, would stop operation of the entire apparatus.

As illustrated in FIGS. 10 and 11, the pallet 198 consists of a body portion 206 and a gripper portion 208 bolted thereto. A multiplicity of storage grooves 210 are provided in the gripper portion 208 along one side edge thereof, at intervals equal to a spacing of component supply portions (guiding channels 44) of the multiplicity of cartridges 9. Each of the storage grooves 210 extends normal to the above side edge, has a width slightly greater than that of the tape 25, and is equipped at its side portions with a pair of retainer jaws 212 indicated by enlarged views in FIGS. 12, 13, 32 and 33. While the retainer jaws, which are made of spring steel, are biased downwardly by their own resiliency, they will not prevent the leading end of the tape 25 fed by the tape feed assembly 41 from advancing into the storage groove 210 because the end is bent up obliquely to form a gliding portion 214. The leading portion of the tape 25 which has been cut by the severing assembly 163 after entering the storage groove 210, is referred to as a unit tape 216 (FIG. 33) which stores and carries a chip C. The cut-off unit tape 216 is accurately positioned in and secured by the gripper 200 consisting of the retainer jaws 212 and the storage groove 210, and transferred while the pallet 198 is being moved. The grippers 200 are disposed on each pallet 198 so that their interval of arrangement is maintained even at a joint of one pallet to another when the two pallets are connected end to end.

As most clearly indicated in FIG. 3, the pallet 198 is guided by a guide rail 218 which is fixed to the frame 18, and driven by a solid cam 222 which is fixed to a drive shaft 220. In detail, two rollers 224 are provided on a top surface of a body portion of the pallet 198, which rollers 224 are rotatable about their vertical axis while engaging a groove in the solid cam 222 whereby the pallet 198 is intermittently movable when the cam 222 is rotated by the drive shaft 220 at a fixed speed, the distance of each movement of the pallet 198 being equal to a spacing of the grippers 200, and thus each of the grippers 200 is moved intermittently while it is sequentially put into alignment with the component supply portions of the multiplicity of cartridges 9 which are equally spaced along the guide rail 218 which defines a line of transfer of the chips or components C, unit tapes 216 or pallets 198, or a line of arrangement of the grippers 200.

Figure 1A:
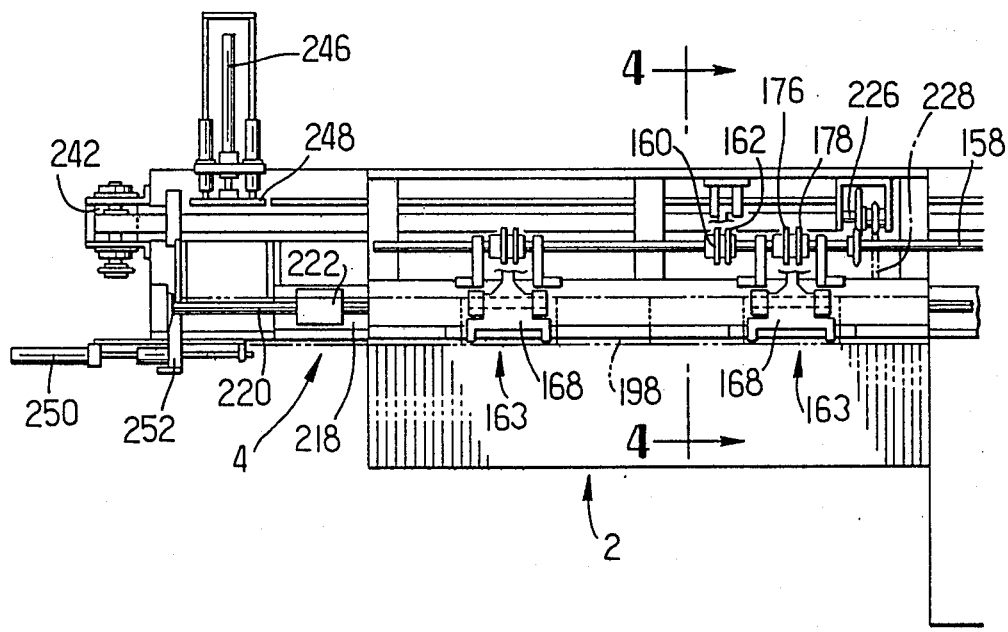
FIGS. 1A and 1B are a schematic plan view of an embodiment of an apparatus of the present invention, with certain parts broken away.
Figure 2A:
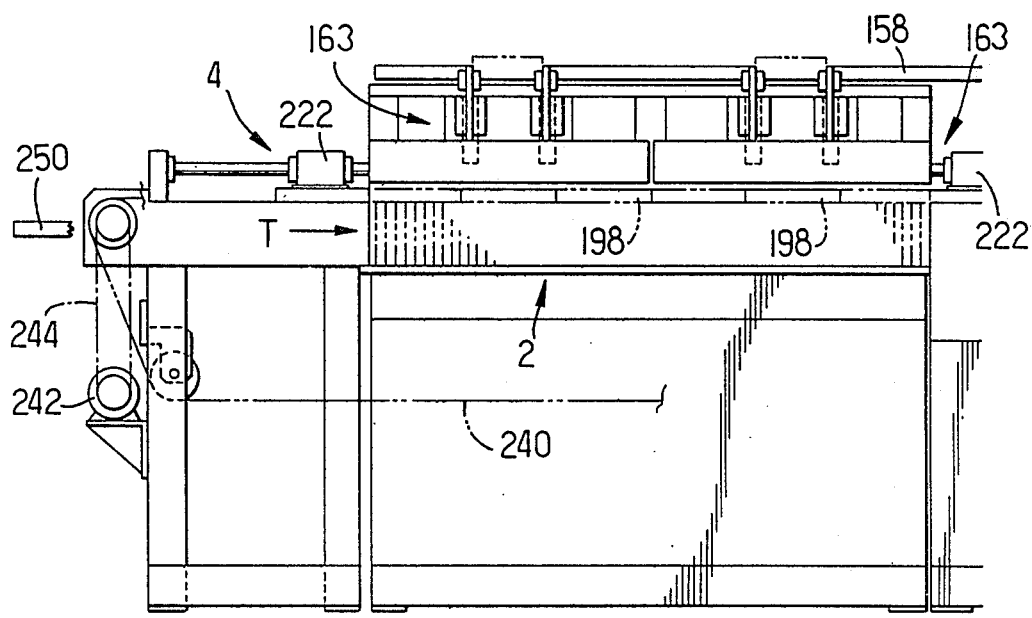
FIGS. 2A and 2B are a schematic elevation of the same apparatus.
Figure 1B:
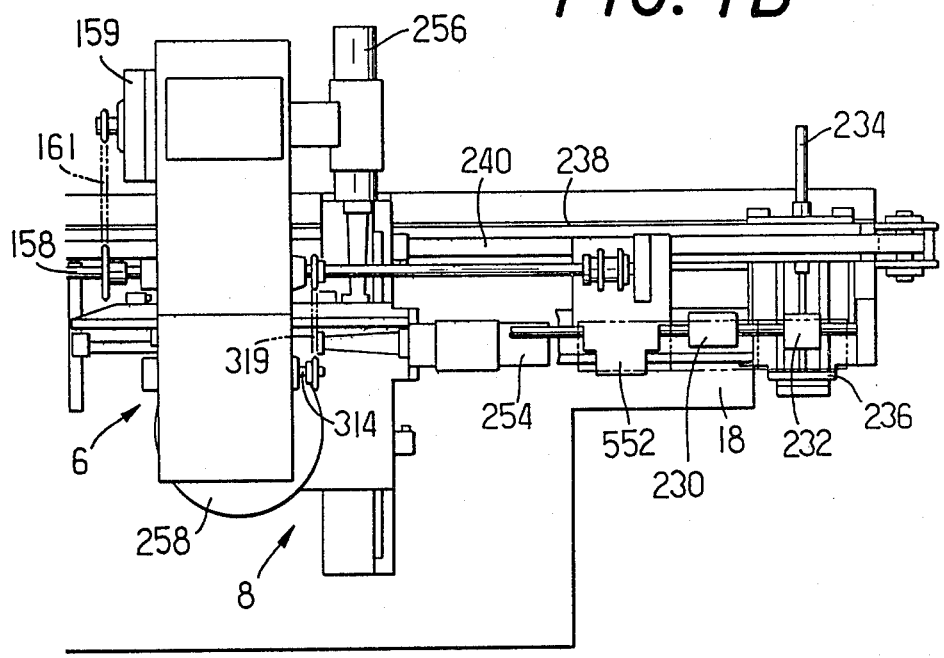
Figure 2B:
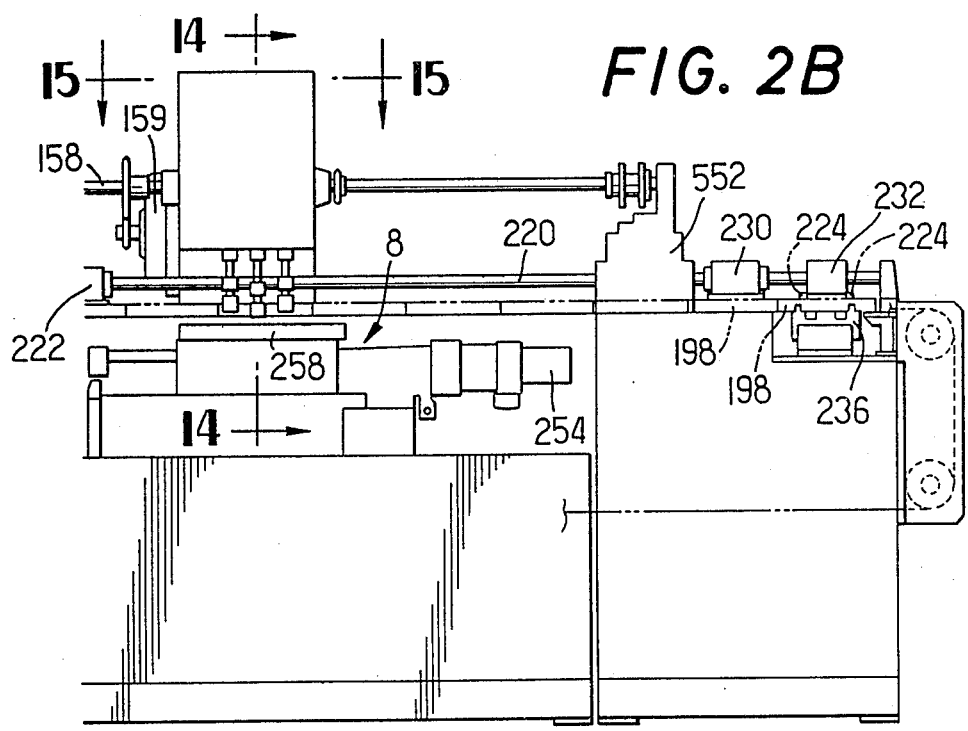
Figure 12:
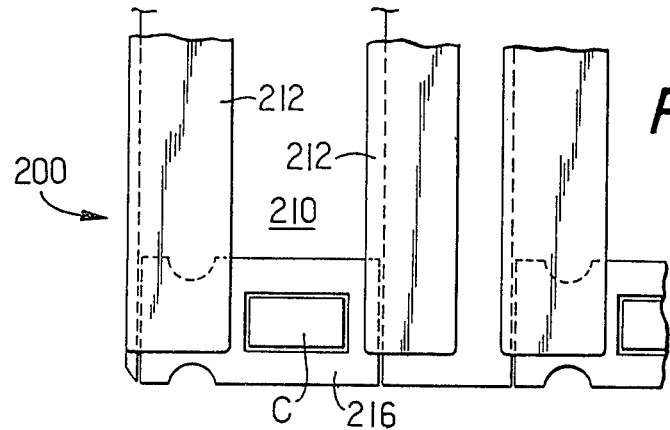
FIG. 12 is an enlarged view of the V portion of FIG. 10.
Figure 13:
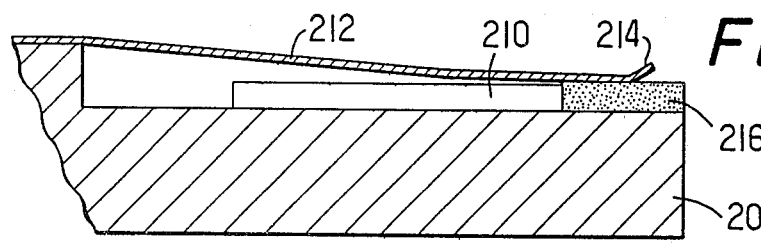
FIG. 13 is an enlarged view of the W portion of FIG. 11.

As clearly shown in FIG. 1, power is imparted to the drive shaft 220 from the previously described drive shaft 158 through an intermediate shaft 226 and a chain 228. The multiplicity of pallets 198 which are connected end to end as indicated by two-dot chain lines in FIGS. 1A, 2A and 2B, are moved to the right by the two solid cams 222 of the same configuration and by solid cams 230 and 232 as seen in FIG. 2B. Both of the latter solid cams 230 and 232 have a simple spiral groove, no part of which is formed normal to the axis of the cams. Since the spiral groove of the solid cam 230 has a greater lead than the groove of the solid cams 222, the pallet 198 is moved at a higher speed by the solid cam 230 than by the solid cams 222. Thus, a pallet 198 is separated, while being moved to the right, from the other pallets 198 which follow as soon as the rollers 224 have engaged the spiral groove of the solid cam 232. As shown in FIG. 2B, the solid cam 232 is slightly smaller in length than a distance between the pair of rollers 224 of the pallet 198, and therefore the pallet 198 which has moved to the right by the solid cam 230 is placed, at the position shown in FIG. 2B, in the condition where neither of the two rollers 224 is in engagement with the spiral groove of the solid cam 232, whereby the pallet 198 is not moved further to the right. The pallet 198 staying at this position is moved to the rear side of the frame 18 by a pusher head 236 which is operated by a hydraulic cylinder 234, and then transferred at a high speed to the left as viewed in FIG. 1B by a belt conveyor 240 while being guided by a guide rail 238. The belt conveyor 240 is driven by a motor 242 shown in FIG. 2A through a chain 244. The pallet 198 which has reached the extreme left-hand side end of the conveyor 240, is moved to the front side of the frame 18 by a pusher head 248 which is operated by a hydraulic cylinder 246, and then put into engagement with the guide rail 218 by a pusher head 252 which is operated by a hydraulic cylinder 250. The pusher head 252 is designed to keep biasing the pallet 198 rightwardly until the leading one of the rollers 224 of this pallet 198 begins to engage the groove of the first solid cam 222.

The chip C which has been transferred to the loading assembly 6 by the transfer assembly 4 with the arrangements described above, is loaded by the loading assembly 6 onto a printed-circuit board placed on the positioning assembly 8. The printed-circuit board is previously coated with an adhesive at predetermined positions at which the chips C are to be mounted. The positioning assembly 8 is moved by servomotors 254 and 256 along both X and Y axes which are perpendicular to each other, and includes a positioning table 258 which is rotated by another servomotor not shown about a vertical axis and holds and positions the printed-circuit board. Since each of such positioning technologies falls within a publicly known art, the detailed explanation thereof is omitted herein. Now, the loading assembly 6 is described in detail.

Figure 15:
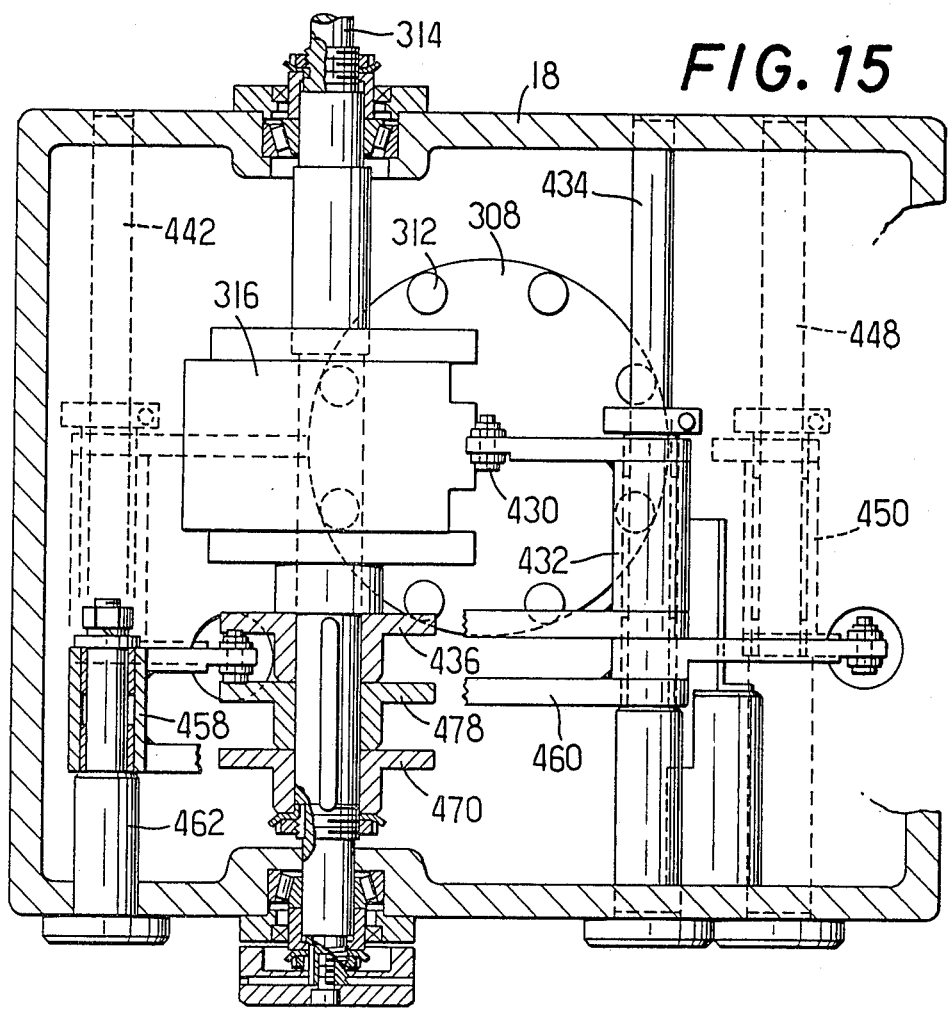
FIGS. 14 and 15 are cross sectional views taken along the lines 14—14 and 15—15 of FIG. 2, respectively.
Figure 14:
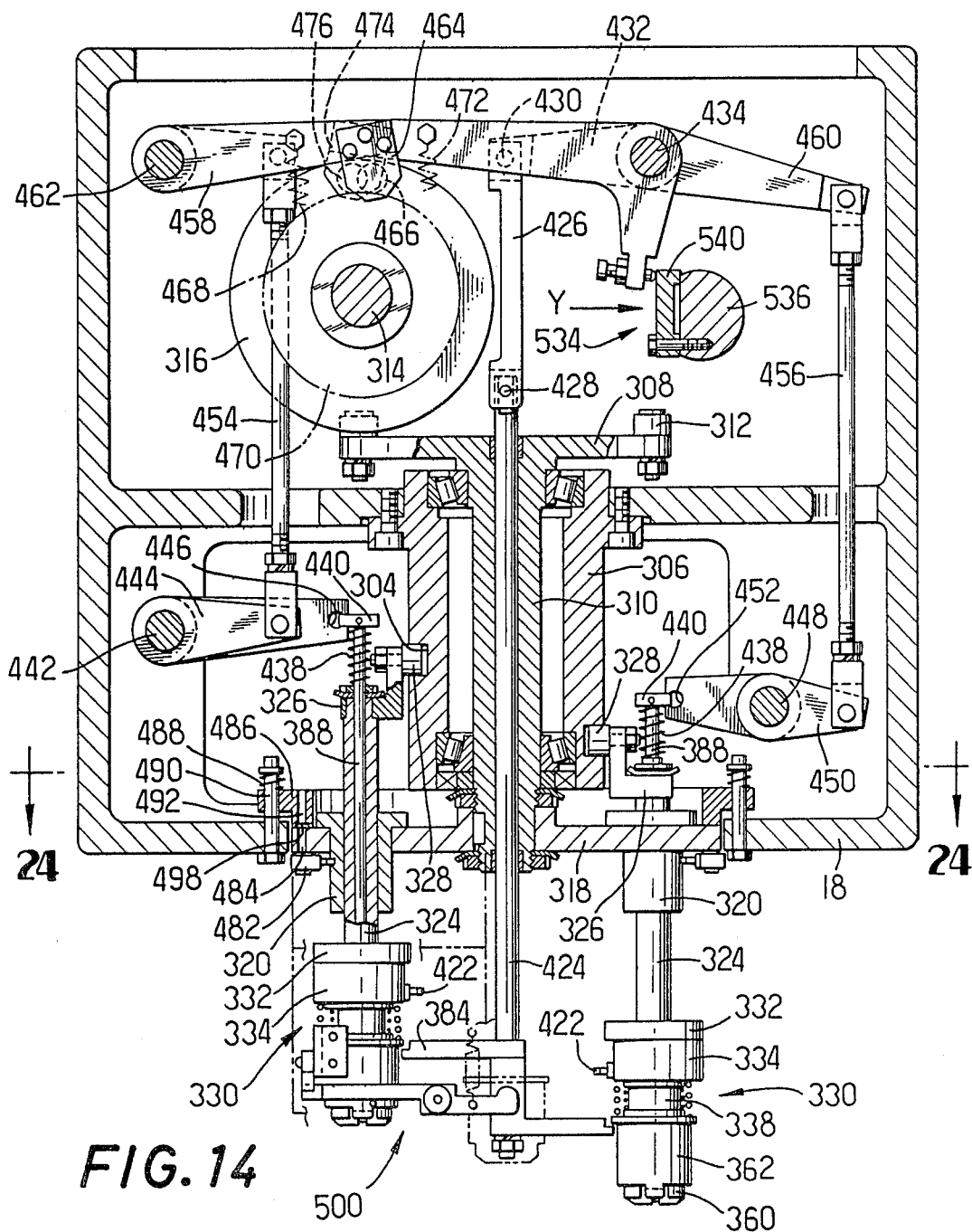

Enlarged views of the loading assembly 6 are presented in FIGS. 14 and 15, wherein there is shown a solid cam 306 which is fixed to the frame 18 and has a cam groove 304 in the circumference of its cylindrical body. In the solid cam 306 is received rotatably via bearings a hollow rotating shaft 310 which is equipped at its upper end with a disc portion 308 to which eight rollers 312 are attached at equally spaced angular positions. These rollers 312 engage a cam groove formed in an indexing cam 316 which is fixed to a drive shaft 314, whereby the rotating shaft 310 is intermittently rotated one eighth turn at one time while the drive shaft 314 is rotated at a fixed speed. The drive shaft 314 is driven by the drive shaft 158 through a chain 319 as seen in FIG. 1B.

To the lower end of the rotating shaft 310 is fixed a rotary disc 318 in which are received eight bushings 320 at equally spaced angular positions. A tubing 324 penetrates through each of the bushings 320 slidably along the axis of the rotating shaft 310. Connected to the upper end of the tubing 324 with a bracket 326, is a roller 328 which engages the cam groove 304 in the solid cam 306. The groove 304 is formed so that the tubing 324 is axially slid from its highest (fully retracted) position shown at left in FIG. 14 to its lowest (fully advanced) position shown at right while the rotary disc 318 is rotated one half turn.

Figure 16:
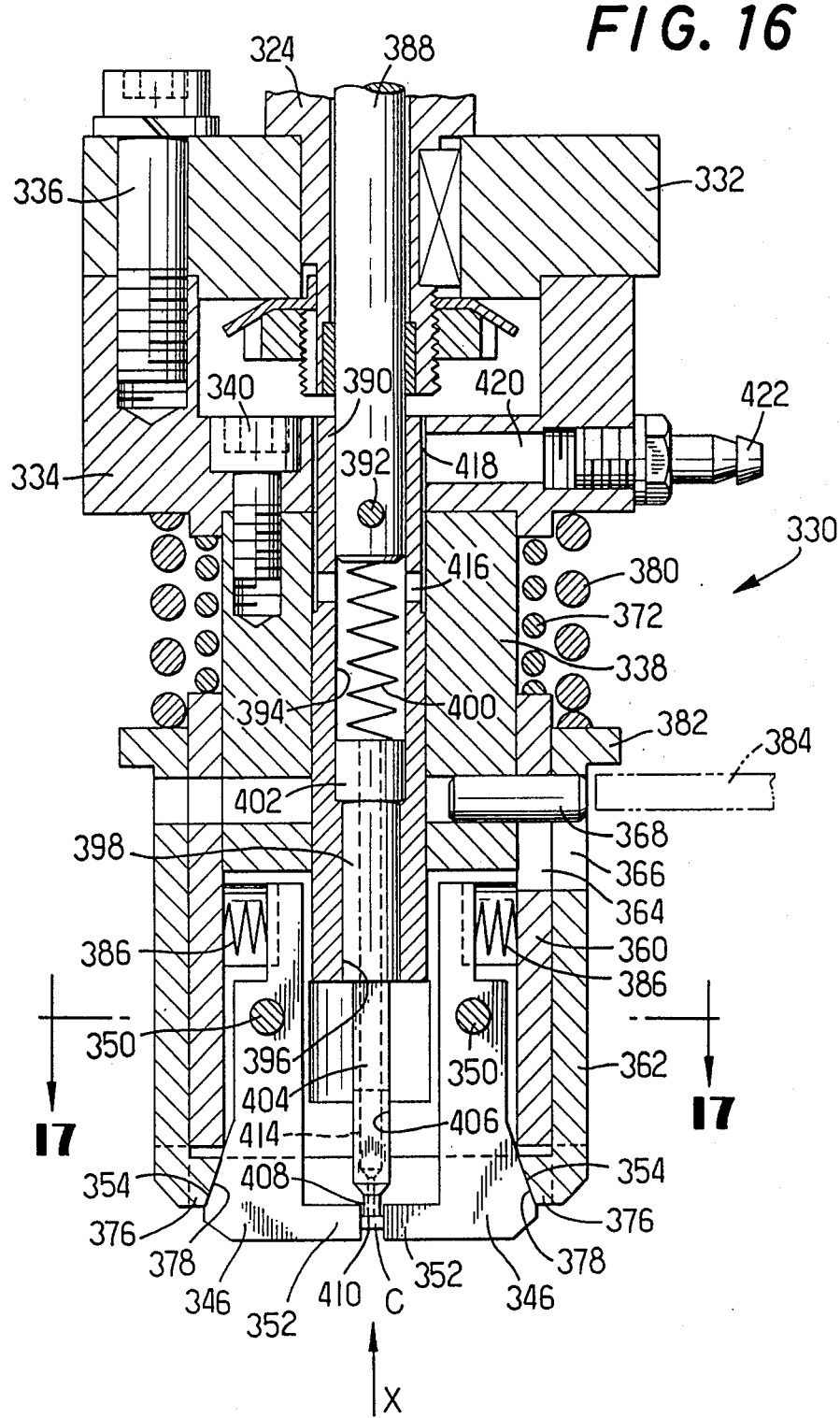
FIG. 16 is an enlarged cross sectional elevation of a chuck of the apparatus shown in FIG. 14.
Figure 17:
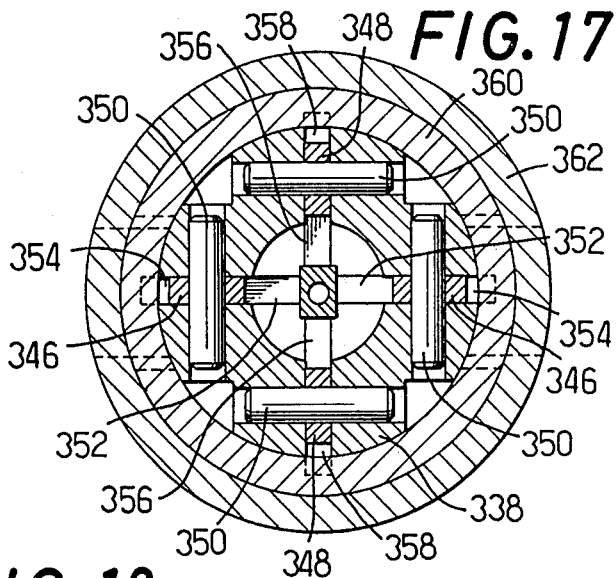
FIG. 17 is a cross section taken along the line 17—17 of FIG. 16
Figure 19:
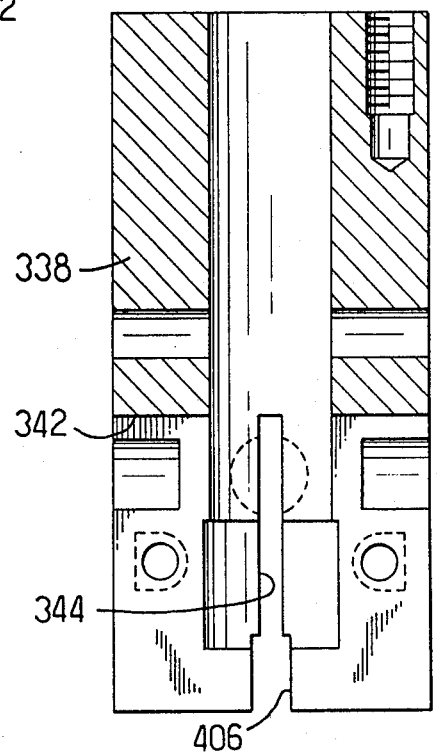
FIG. 19 is a cross sectional elevation of a body of the chuck shown in FIG. 16.

Attached to the lower end of the tubing 324 is a chuck 330, enlarged views of which are presented in FIGS. 16 and 17, wherein there is shown a chuck mounting plate 332 which is fixed to the lower end of the tubing and to which is fixed with bolts 336 a cup-shaped member 334 to which a chuck body 338 is fixed with bolts 340. As illustrated in FIG. 19, two slots 342 and 344 perpendicular to each other are formed in the lower end portion of the chuck body 338, in which are received a first pair of chuck jaws 346 and a second pair of chuck jaws 348, respectively, as shown in FIG. 17. Each of the jaws is pivotably supported by a pin 350. As clearly indicated in FIG. 16, the first pair of jaws 346 are provided at the lower ends with a pair of internally opposing inner protrusions 352 for holding the chip C therebetween, and with outer tapered portions 354 which constitute a part of a cone having downwardly increasing diameters. As clearly seen in FIG. 17, the second pair of chuck jaws 348 are also provided with inner protrusions 356 and outer tapered portions 358.

Figure 20:
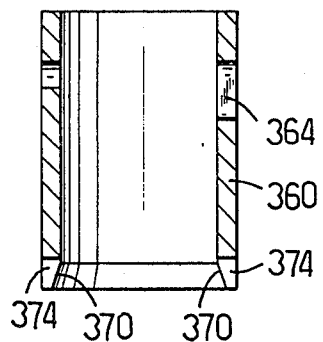
FIG. 20 is a cross sectional elevation of an inner sleeve of the chuck shown in FIG. 16.
Figure 21:
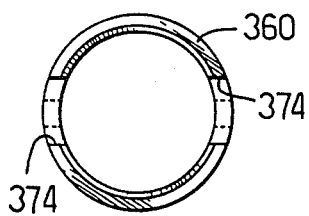
FIG. 21 is a bottom plan view of the same.
Figure 22:
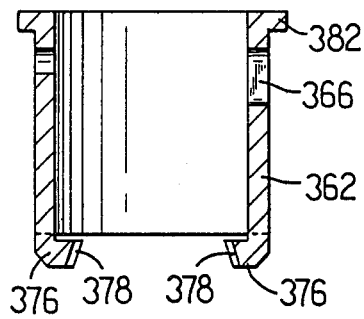
FIG. 22 is a cross sectional elevation of an outer sleeve of the chuck shown in FIG. 16.
Figure 23:
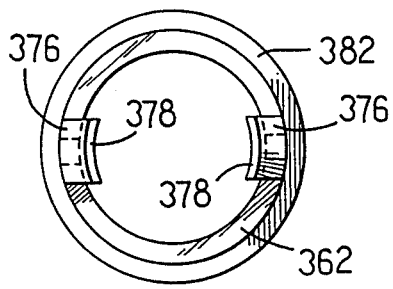
FIG. 23 is a bottom plan view of the same.

An inner sleeve 360 is slidably fitted to an outer surface of the chuck body 338 and in addition, an outer sleeve 362 is slidably fitted to an outer surface of the inner sleeve 360. These inner and outer sleeves 360 and 362 have axially formed elongated holes 364 and 366, respectively, through which a pin 368 fixed to the chuck body 338 penetrates, thereby not only preventing the sleeves 360 and 362 from rotating but also limiting an axial sliding movement thereof to within a fixed range. As shown in FIGS. 20 and 21, the inner sleeve 360 has at its lower inner portion a tapered surface 370 mating the outer tapered portions 358 of the second pair of chuck jaws 348, and is biased by a coil spring 372 downwardly (toward the free end of the chuck 330), i.e., in the direction that causes the chuck jaws 348 to be closed. On the other hand, the outer sleeve 362 is provided with a pair of engagement tabs 376 which protrude through a pair of cut-outs 374 formed in the lower end of the inner sleeve 360. The ends of the tabs 376 have tapered surfaces 378 mating the outer tapered portions 354 of the first pair of chuck jaws 346. The outer sleeve 362 is normally biased by a coil spring 380 downwardly, i.e., in the direction that causes the chuck jaws 346 to be closed with the tapered surfaces 378 forced against the outer tapered portions 354. When a jaw opening member 384 is lifted in engagement with an upper flange 382 formed at the upper end of the outer sleeve 362, the sleeve is lifted against a biasing pressure of the coil spring 380. After the outer sleeve 362 has been lifted a preset distance, its engagement tabs 376 are put into contact with the lower end of the inner sleeve 360 and therefore the inner sleeve is also lifted together with the outer sleeve. In other words, the outer sleeve 362 also serves as a jaw opening member for the inner sleeve 360.

Between parts of the chuck jaws 346 above the pins 350 and the inner sleeve 360 a pair of coil springs 386 are disposed for biasing the chuck jaws 346 in a direction of opening them. The chuck jaws 348 are similarly biased in the opening direction by a not-shown coil spring. Lifting up of the outer sleeve 362 therefore opens the chuck jaws 346, and subsequent lifting up of the inner sleeve 360 opens the chuck jaws 348.

Figure 18:
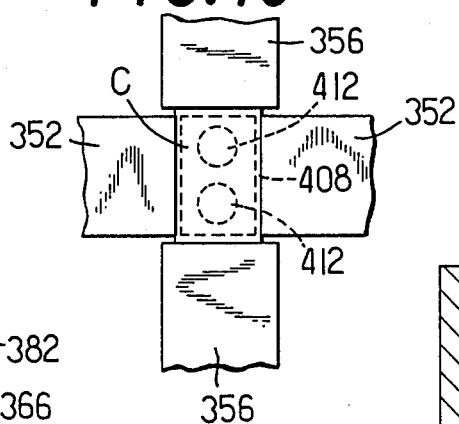
FIG. 18 is a view taken in the direction of the arrow X of FIG. 16.

There is inserted an up-down rod 388 in a hole through the tubing 324. A lower portion of the up-down rod 388 is received in a cylindrical member 390 and fixed by a pin 392. A hole 394 through the cylindrical member 390 is a stepped hole which has a small diameter portion 396 at its lower part in which a sucker 398 as a pick-up member is slidably received while being biased downwardly by a coil spring 400. With this arrangement, the sucker 398 is projected into an opening defined by the first and second pairs of chuck jaws 346 and 348 when the up-down rod 388 is moved down. The sucker 398 includes a slightly larger diameter head portion 402 at its upper end and a quadrangular prism portion 404 at its lower portion, the head portion 402 preventing the sucker 398 from projecting out of the cylindrical member 390 beyond a preset limit, and the quadrangular prism portion 404 being fitted in a slot 406 slightly greater in width than the slot 344 formed in the lower end portion of the chuck body 338 as illustrated in FIG. 19 and thereby preventing the sucker 398 from rotating. The quadrangular prism portion 404 is provided at its lower end with a tab 408 which is smaller in width than the chip C to be picked or sucked up therewith as is most clearly shown in FIG. 33, the end 410 of the tab 408 having two suction openings 412, as shown in FIG. 18, which are communicated with the thru-hole 394 in the cylindrical member 390 through a passage 414 formed axially through the sucker 398. The thru-hole 394 is communicated with a hose fitting 422 through a hole 416 formed radially in the cylindrical member 390, through an annular gap 418 formed among the cylindrical member 390, chuck body 338 and cup-shaped member 334, and through a port 420 formed radially in the cup-shaped member 334.

The previously indicated jaw opening member 384 to lift the outer sleeve 362 of the chuck 330 is, as seen in FIG. 14, a member which has two arms horizontally extending in opposite directions at different heights and is fixed to the lower end of a lift-lower rod 424 slidably received in the hole through the rotating shaft 310. The upper end of the lift-lower rod 424 is connected to an arm of a lever 432 through a connecting rod 426 and pins 428 and 430. As most clearly shown in FIG. 15, the lever 432 is pivotably supported by a shaft 434 fixed to the frame 18, and includes another arm to the end of which is attached a roller not shown. The lever 432 is biased by a spring not shown in the direction that causes it to pivot counterclockwise as viewed in FIG. 14, whereby the said roller is normally kept in contact with a plate cam 436 fixed to the previously indicated drive shaft 314. Consequently, as the plate cam 436 is rotated by the drive shaft 314 the lever 432 is pivoted about the shaft 434 in the direction to lift the jaw opening member 384 thereby allowing the chuck 330 to unchuck the chip C.

On the other hand, the up-down rod 388 to move up and down the sucker 398 of the chuck 330 is, as illustrated in FIG. 14, kept biased upwardly by a spring 438, and equipped at its upper end with an engagement member 440 which, when the chuck 330 is in the highest position shown at left in FIG. 14, engages an engagement slot 446 which is formed in one of two arms of a lever 444 pivotably supported by a shaft 442 fixed to the frame 18. On the other hand, when the chuck 330 in the lowest position shown at right in FIG. 14, the above-mentioned engagement member 440 engages an engagement slot 452 which is formed in one of two arms of a lever 450 pivotably supported by a shaft 448 fixed to the frame 18. The other arm of the lever 444 (450) is connected to an arm of a lever 458 (460) with a connecting rod 454 (456). The lever 458 is pivotably supported by a shaft 462 fixed to the frame 18, and to the other arm of the lever 458 is attached a roller 466 via a bracket 464. The lever 458 is biased by a spring 468 in the direction that causes it to pivot clockwise as viewed in FIG. 14, whereby the roller 466 is normally kept in contact with a plate cam 470 fixed to the drive shaft 314. Similarly, the lever 460 is pivotably supported by the shaft 434 and biased by a spring 472 in the counterclockwise direction whereby a roller 476 attached to the other arm of the lever 460 via a bracket 474 is normally kept in contact with a plate cam 478 fixed to the drive shaft 314.

Figure 24:
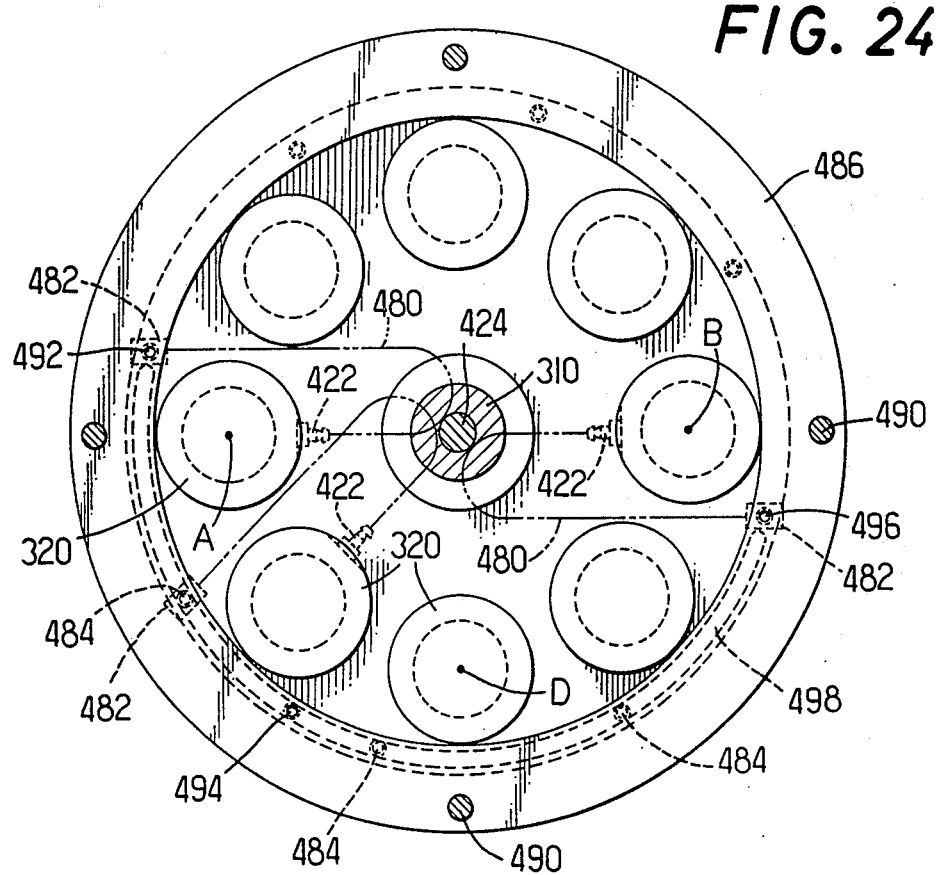
FIG. 24 is a cross sectional view taken along the line 24—24 of FIG. 14.

The hose fitting 422 which is communicated with the suction openings 412 of the sucker 398 is connected, with a hose 480 only location of which is indicated by a two-dot chain line in FIG. 24, to each of joint members 482 fixed to the rotary disc 318 in which are formed eight holes 484 communicating with the joint members 482. A portion of the rotary disc 318 wherein the holes 484 are formed is air-tightly covered as illustrated in FIG. 14 with an annular member 486 which is forced against the surface of the said portion of the disc by a spring 488 and restrained by bolts 490 from rotating together with the disc 318. The annular member 486 has three fitting holes 492, 494 and 496. Fittings to be attached to these holes are mutually independently connected to a vacuum source. While the fitting hole 494 is constantly supplied with a negative air pressure as long as the vacuum source is present, the fitting holes 492 and 496 are supplied with the same only at a specified time. The fitting hole 496, however, may be given a positive air pressure as well at a specified time. The hole 494 is communicated, through a groove 498 formed in the annular member 486, with holes 484 which are provided corresponding to the plural member of chucks 330 that are present between a component receiving position A and a component loading position B, both positions being indicated in FIG. 24.

Figure 27:
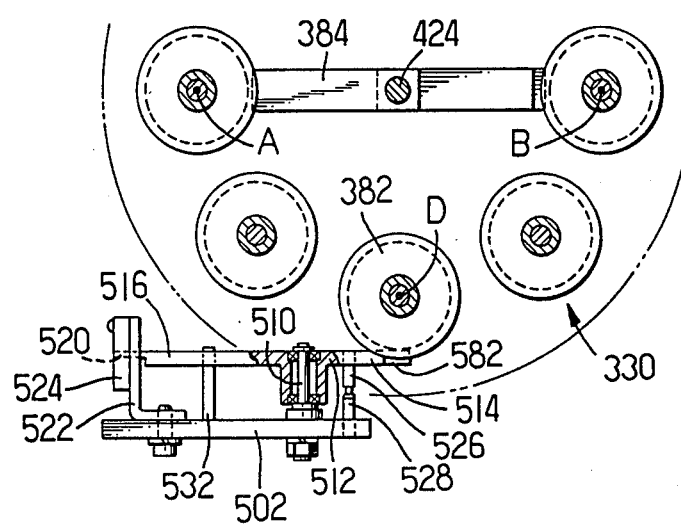
FIGS. 25, 26 and 27 are front, side and plan (partially in cross section) views of a chucking failure detector shown in FIG. 14, respectively.
Figure 25:
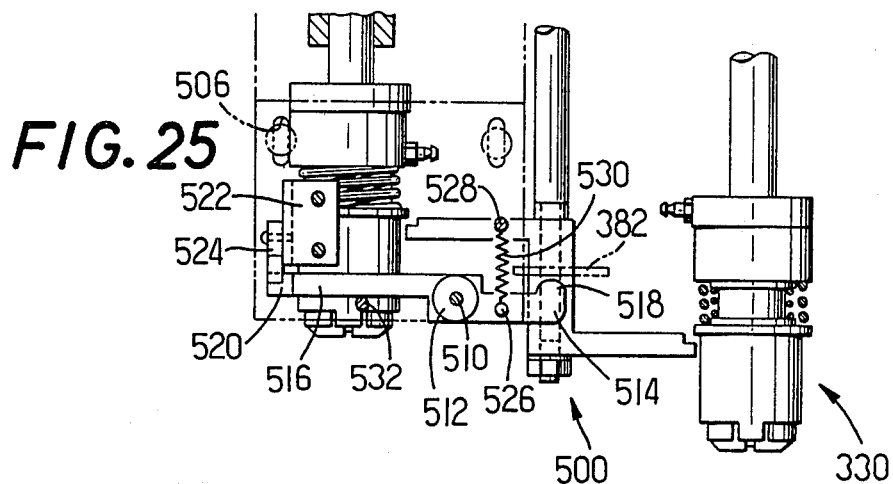
Figure 26:
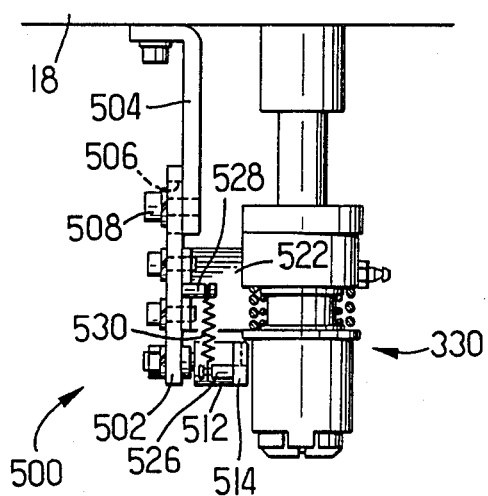

Although all chucks 330 that are moving between the component receiving and loading positions A and B must hold a chip C, any of those chucks may be moving without holding a chip for some reason or other. For monitoring for this faulty condition, there is provided a chucking failure detector 500 indicated in FIG. 14. Although the chucking failure detector 500 shown in FIGS. 25 through 27 is actually built on a mounting plate 502 fixed to the frame 18, the plate 502 is eliminated from a view of FIG. 25 for easy understanding of the detector 500 and only the location is indicated by two-dot chain lines. The mounting plate 502 is attached to a bracket 504 fixed to the frame 18, with a bolt 508 and an elongated hole 506 so that the height of the plate may be adjusted. A detector lever 512 is pivotably connected with a pin 510 to the mounting plate 502. The detector lever 512 are provided with two arms 514 and 516 horizontally extending in opposite directions, the arm 514 having at its end an upward semi-circular tab 518 and the arm 516 a thin-walled portion 520. The tab 518 is formed so that it is located below a flange 382 of the outer sleeve 362 when the chuck 330 is located at a component detecting position D indicated in FIG. 27. The thin-walled portion 520, on the other hand, is formed so that it can interrupt a light emitting from a light emitting element to a light receiving element of a photomicro sensor 524 which is connected to the mounting plate 502 via a bracket 522, when it is inserted in a slot formed in the photomicro sensor 524. While the detector lever 512 is biased in the direction that causes the tab 518 to move upward, by a coil spring 530 connected at one end to a pin 526 on the arm 514 and at the other end to a pin 528 on the mounting plate 502, the lever 512 is kept in the position shown in FIG. 25 because the arm 516 is stopped by a stop pin 532 on the mounting plate 502. In this position, the thin-walled portion 520 will not interrupt the light of the photomicro sensor 524. The light is interrupted by the portion 520 when the tab 518 is pushed down by the flange 382 of the outer sleeve 362 beyond the position shown in FIG. 25.

The chucking failure detection is explained below more in detail. The chucks 330 in this preferred embodiment of the invention are intended to chuck chips C of sizes ranging from a maximum length of 3.2 mm by a maximum width of 2.5 mm up to a minimum length of 2.0 mm by a minimum width of 1.25 mm. A downward sliding movement of the outer sleeve 362 necessary to chuck a chip C is increased as a length of the chip C becomes larger. In this specific embodiment, all parts involved in the chucking are dimensioned such that a downward sliding movement of the outer sleeve 362 is equal to 7.0 mm when the tab 408 instead of a chip C is chucked by the first pair of jaws 346 while the same amount is 5.9 mm when a chip C having a length of 2.0 mm, i.e., the lower limit, is chucked. Since the chuck 330 is gradually lowered by means of the solid cam 306 as it is moved from the component receiving position A toward the component loading position B, the flange 382 of the outer sleeve 362 is lowered almost down to the position shown in FIG. 25 by the two-dot chain lines before the chuck 330 has passed the component detecting position D. If any chip C of not less than the minimum length is gripped in the chuck 330, the chuck passes the position D with the flange 382 out of contact with the tab 518 of the detector lever 512. If no chip C is gripped in the chuck 330, however, the flange 382 comes into contact with the tab 518 and lets the detector lever 518 to pivot against a biasing pressure of the spring 530 when the chuck passes the position D because the flange 382 is then located at a level 1.1 mm lower than when the chip C of the minimum length is gripped in the chuck. As a result, the thin-walled portion 520 is raised and interrupts the light of the photomicro sensor 524 whereby a chucking failure signal is generated by the sensor 524.

Figure 28:
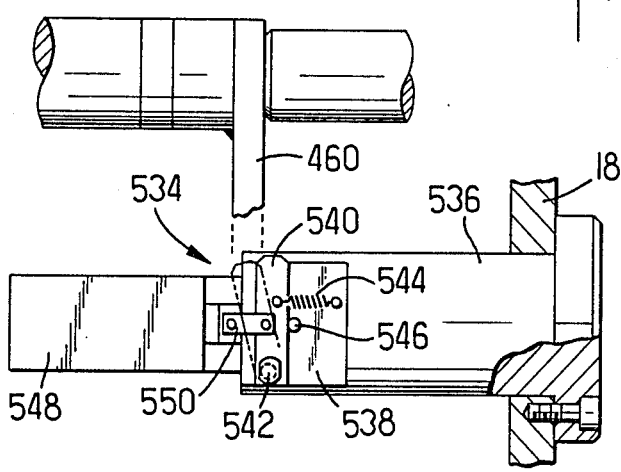
FIG. 28 is a view taken in the direction of the arrow Y of FIG. 14.

In this embodiment, a stop device 534 illustrated in FIG. 28 is provided to stop, according to the above chucking failure signal, a pivoting movement of a lever 460 which is one of elements of a sucker drive device. The location of the stop device 534 is indicated in FIG. 14. The stop device 534 is equipped with a columnar member 536 which is fixed to the frame 18. A stop member 540 is pivotably attached, with a stepped screw 542, to a flat part 538 formed at the end portion of the columnar member 536. The stop member 540 is normally kept by a spring 544 in contact with a stop pin 546 on the flat part 538. The stop member 540, on the other hand, is connected, with a link 550, to a solenoid 548 which is an actuator for pivoting the stop member against a biasing force of the spring 544. When the solenoid 548 is energized in response to the chucking failure signal, the stop member 540 is pivoted to the position shown by two-dot chain lines in FIG. 28 and consequently put into engagement with the lever 460 thereby preventing a pivoting movement of the lever. The lever 460 includes an arm which the stop member engages as illustrated in FIG. 14, in addition to the arm by which power is received from the plate cam 478 and the arm by which the received power is transmitted through the connecting rod 456 to the lever 450.

Figure 29:
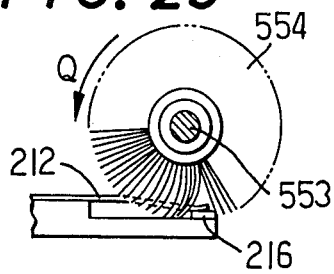
FIG. 29 is an illustration showing the theory of operation of a tape disposal assembly shown in FIG. 1.

On the down-stream side of the loading assembly 6 constructed as described above (On the right-hand side of the mounting apparatus in FIG. 1B), is provided a tape disposal assembly 552 shown in FIGS. 1B and 2B for disposing the unit tapes 216 from which the chips C have been removed by the loading assembly 6. As shown in FIG. 29, the tape disposal assembly 552 is equipped with a rotary brush 554 fixed to a drive shaft 553. The unit tapes 216 are swept out of the storage grooves 210 by the rotary brush 554 which is rotated by the drive shaft 553 in a direction designated by character Q in FIG. 29. The drive shaft 553 is driven by the drive shaft 220 (shown in FIG. 2) through a transmission mechanism not shown.

Now, the operation of the mounting apparatus of this embodiment is explained below.

When the speed-reducer-equipped motor 159 is turned on, the drive shafts 158, 220 and 314 are all started to rotate at the same time.

Upon rotation of the drive shaft 158, the lever 144 shown in FIG. 4 is first pivoted in the clockwise direction and consequently the pivoting plate 136 shown in FIG. 3 in the counterclockwise direction, and as a result, the output plate 130 is lifted. If, at this time, none of the solenoids 122 is in the energized position and the corresponding relay pins 126 are located out of alignment with the plate 130, the plate 130 will not push up the relay pins 124. Therefore, the corresponding transmission mechanism from the rod 118 up to the gear 74 is not at all operated and the sprocket wheel 45 remains at rest. Thus, none of the tapes 25 in the multiplicity of the tape cartridges 9 disposed in parallel is either fed, or severed even though the movable blade 84 is lowered by further rotation of the drive shaft 158.

If, however, one or more of the solenoids 122 are energized and the corresponding relay pins 126 are located right above the plate 130 before the pivoting plate 136 has been rotated counterclockwise, all of those relay pins 126 are simultaneously pushed up by the plate 130 upon the rotation of the plate 136 and the corresponding rods 118 are lifted. The lifting movement of the rod 118 will cause the pair of arms 82 to pivot upwardly, the feed pawl 84 to move upwardly and thus the gear 74 and the sprocket wheel 45 fixed thereto to rotate counterclockwise. At an early point in time of this operation, the detent pawl 92 is not put in engagement with the gear 74. As the upward pivoting movement of the arms 82 proceeds, however, the detent pawl 92 pivots accordingly and its free end comes closer to the teeth of the gear 74. When the end of the detent pawl 92 has come into contact with a tooth of the gear, the pin 98 begins to move away from the pawl 92. By further pivoting movements of the arms 82 and the resultant further rotation of the gear 74, the free end of the detent pawl 92 is interposed between a pair of adjacent teeth 80 of the gear 74, making the sprocket wheel 45 to stop at an exact position. In the meantime, the sprocket wheel 45 has rotated together with the gear 74 a specified angle, feeding the tape 25 a distance equal to the spacing of the component storage holes or apertures 30 formed therein. The leading end of the tape 25 thus fed, is advanced into a gripper 200 of a pallet 198. At the same time, the upper covering tape 38 is separated from the tape 25 by a length equal to the distance of the tape 25 that has been fed, and the separated length of the covering tape 38 is wound on the take-up reel 54 as is shown in FIG. 31.

By a continuing rotation of the drive shaft 158, which will no more pivot the pivoting plate 136 counterclockwise (because a contour of the cam to control the plate is so determined), the movable blade 184 is lowered and as a result, the said one or more tapes 25 selected by the energized solenoids 122 and fed the specified distance are all severed simultaneously while they are accurately positioned by the sprocket wheels 45 whose free movements are prevented by the corresponding detent pawls 92 which have been already put into engagement with the corresponding gears 74.

In the following step, the movable blade 184 is lifted and the pivoting plate 136 is pivoted clockwise. As the clockwise pivoting movement of the plate 136 proceeds, the relay pin 136 and rods 100, 118 are lowered, and thus the arms 82 are permitted to pivot downwardly due to resiliency of the spring 110. As the arms 82 are pivoted downwardly, the feed pawl 84 is moved downwardly and its free end clears one tooth of the gear 74 and engages the following tooth. Although a moment is applied to the gear 74 in the reverse direction when the end of the feed pawl 24 clears the said one tooth, the gear 74 is prevented by the anti-reverse member 90 from reversing. At a later point in time of the downward pivoting movement of the arms 82, the pin 98 comes into contact with the detent pawl 92 and pushes the same causing its free end to disengage from the gear 74.

After the head 132 of the relay pin 126 has rested on the upper surface of the movable member 124, the solenoid 122 is de-energized and the movable member 124 is returned to its original position shown in FIG. 3.

During a period of time after the tape 25 has been severed by the severing assembly 163 as described above and before the plate 130 is again lifted, the pallets 198 are moved by means of the solid cams 222 by a distance equal to the spacing of the grippers 200, and each of the grippers 200 is stopped in alignment with the tape cartridge 9 which is next to the cartridge 9 with which the gripper 200 was aligned before the pallets are moved.

Some of the solenoids 122 are again energized and the corresponding relay pins 126 are moved to a position right above the end of the plate 130. Consequently, if the plate 130 is subsequently lifted, the corresponding sprocket wheels 45 are rotated whereby the tapes 25 selected by energized solenoids 122 are fed the specified distance and the leading ends of the tapes are held in the grippers 200 of the pallets 198 which have been positioned in place as is shown in FIG. 32. Then, the movable blades 184 are lowered and the leading end portions of the tapes held in the respective grippers 200 are severed.

With the above steps of operation being carried out repeatedly, the unit tapes 216 carrying different types of chips C are held, in such order that they are mounted by the loading assembly 6, in the grippers 200 of the pallets 198 which have been moved to the right beyond the right-hand side end (as seen in FIG. 1) of the component supply assembly 2.

It is noted that all the chips C to be mounted on a single printed-circuit board need not always be held in a single pallet 198 but may rather be held in two or more pallets 198. It is also possible, on the contrary, that a single pallet 198 may hold the chips C which are to be mounted on two or more printed-circuit boards.

Figure 33:
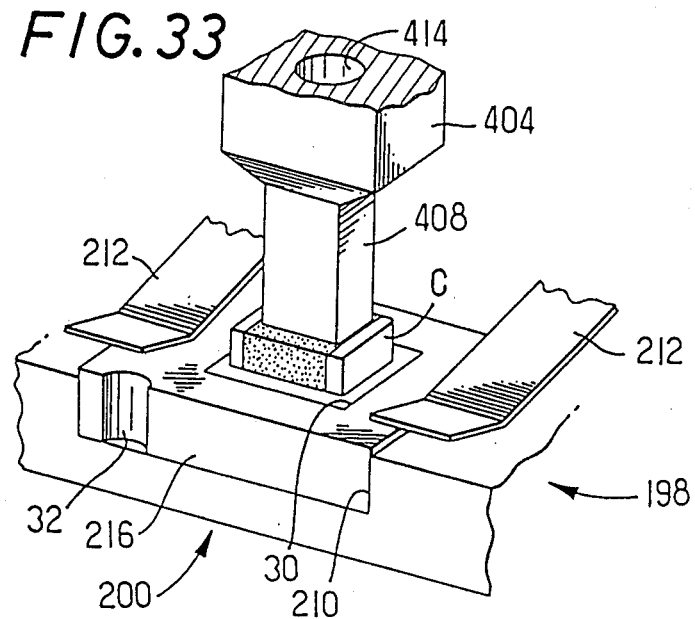
FIG. 33 is a perspective view illustrating in enlargement a sucker of the chuck shown in FIG. 16, and the severed leading end of the tape from which a component is sucked up by the sucker.

The chips C are then taken out one after another by the loading assembly 6 from the unit tapes 216 as illustrated in FIG. 33 which have been transferred to the loading assembly 6 by the transfer assembly 4 as explained above, and the chips are mounted on printed-circuit boards as explained below in detail.

When the drive shaft 314 shown in FIG. 14 is rotated at a fixed speed the rotary disc 318 is rotated intermittently one eighth turn at one time. While the rotary disc 318 is rotated, the levers 444, 450, 458 and 460 are all stopped at the positions shown in FIG. 14. The rotary disc 318 is stopped when one of the eight chucks 330 has reached the component receiving position A, another chuck 330 reached the component loading position B and another chuck 330 reached the component detecting position D. When the disc 318 has stopped its rotation in such timing, the engagement members 440 fixed to the upper end of the up-down rods 388 of the chucks 330 which have been located at the component receiving and loading positions A and B are put into engagement with the engagement slots 446 and 452 formed in the levers 444 and 450, respectively.

By further rotation of the drive shaft 314, the lever 432 engaging the plate cam 436 is pivoted causing the lift-lower rods 424 and the jaw opening member 384 to be lifted. When the jaw opening member 384 is lifted, the outer sleeve 362 and the inner sleeve 360 are sequentially lifted in that order. As a result, the first pair of chuck jaws 346 are first opened against a biasing pressure of the spring 386 and the second pair of chuck jaws 348 are then opened a little later in the similar manner.

In the next step, the levers 458 and 460 engaging the plate cams 470 and 478 respectively are pivoted to lower the up-down rod 388, cylindrical member 390 and sucker 398, and the sucker 398 is projected into the opening defined by the first and second pairs of chuck jaws 346 and 348. The end of the sucker 398 of the chuck 330 located at the component receiving position A is thus put into contact with the surface of a chip C which is stored in the aperture in the unit tape 25 held in one of the grippers 200 of a pallet 198. Even after the end of the sucker 398 has contacted the chip C, the up-down rod 388 and the cylindrical member 390 continue to be lowered while compressing the coil spring 400 whereby the end of the sucker 398 is forced against the surface of the chip C with a force equal to the biasing pressure of the coil spring 400. Since a negative air pressure is applied to the fitting attached to the fitting hole 492 through switching operation of a valve not shown after the chuck 330 has been located at the component receiving position A, the chip C is sucked up by the end of the sucker 398, as is clearly shown in FIG. 33, with the negative air pressure when the end is forced against the chip C. While the above operation is being performed at the component receiving position A, the chip C being sucked up in the chuck 330 located at the component loading position B is forced against an adhesive-coated portion of a printed-circuit board placed on the positioning assembly 8.

In accordance with a further rotation of the drive shaft 314, the up-down rods 388 are then lifted whereby the chuck 330 located at the component receiving position A is raised with the sucker 398 sucking up the chip C while the chuck 330 at the component loading position B is raised with the sucker 398 leaving the chip C on the printed-circuit board because the negative air pressure having been applied to the fitting hole 496 is replaced by a positive air pressure through a switching operation of a valve immediately after the sucker 398 has been lowered and pressed the chip C against the surface of the printed-circuit board. The application of that positive air pressure is intended to promptly remove the negative air pressure acting on the end of the sucker 398. When a component mounting cycle time may be longer, such application of a positive air pressure to the fitting hole 496 may be replaced by simply communicating the fitting hole with atmosphere.

When the drive shaft 314 is further rotated, the jaw opening member 384, and both the outer and the inner sleeves 362 and 360 are lowered. Soon after, the tapered surface 370 of the inner sleeve 360 comes into contact with the tapered portions 358 of the second pair of chuck jaws 348. When the inner sleeve 360 is lowered further from this position, the second pair of chuck jaws 348 are closed against the biasing pressure of a coil spring not shown with the tapered portions 358 forced against the mating tapered surface 370, whereby the jaws 348 of the chuck 330 at the component receiving position A touch opposite side faces of the chip C and grip it. In this connection, the inner sleeve 360 is accurately fitted in the chuck body 338 to assure symmetrical closing motions of the jaws with respect to the centerline of the sucker 398. If, therefore, the chip C sucked up by the sucker 398 was slightly shifted out of position along its length, it would be corrected into position by the jaws before it is gripped by the same. In addition, there is no fear that the chip C is damaged due to excessive gripping force because the gripping force is fixedly determined by a biasing pressure of the spring 372. After the chip C has been gripped by the jaws 348, the inner sleeve 360 stops its lowering motion but the outer sleeve 362 continues to be lowered, its tapered surfaces 378 come into contact with the mating tapered portions 354 of the first pair of chuck jaws 346, and the jaws 346 are closed. As a result, the chip C is gripped as shown in FIG. 16 after its possible error in position is corrected along its width. Thus, the chip C is finally held by the sucker 398, and the first and second pairs of jaws 346 and 348 while being accurately aligned with the centerline of the sucker 398.

Even when the drive shaft 314 is further rotated from the above position, the levers 444, 450, 458 and 460 will no more be pivoted, i.e., remain at the positions shown in FIG. 14. But, instead, the rotary disc 318 will then start rotating. When the rotary disc 318 is started, the hole 484 shown in FIG. 24 is put out of alignment with the fitting hole 492 with a result that a supply of the negatively pressurized air is instantaneously interrupted, but the hole 484 is immediately communicated with the groove 498 and the negative air pressure is again applied to the hole 484 whereby there is no fear that the chip C falls away from the end of the sucker 398.

The rotary disc 318 is stopped after it has rotated one eighth turn and the pallet 198 is stopped after it has moved a distance equal to the spacing of the grippers 200. Thereafter, the above described series of operation are repeated whereby the chips C are transferred one after another from the component receiving position A up to the component loading position B where they are then mounted on the specified portions of the printed-circuit board.

Figure 30:
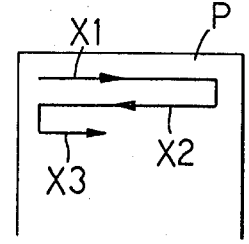
FIG. 30 is a diagrammatic representation showing the rectilinear path along which the workpieces are mounted by the apparatus of FIGS. 1A and 1B.

In this embodiment, the repetition of the above steps of operation of the mounting apparatus enable the chips C to be mounted on the printed-circuit board P in the order as illustrated in FIG. 30 wherein the chips C are sequentially mounted first along a straight line X1 from left to right, which line X1 is parallel to the X axis and begins at the left, upper corner of the board P. After a chip C is mounted at a position at the right-hand side end of the line X1, the next chip C is mounted at a position at the right-hand side end of another straight line X2 which is parallel to and apart a slight distance along the Y axis from the line X1. Then, the following chips C are mounted sequentially from right to left along the line X2. After a chip C is mounted at a position at the left-hand side end of the line X2, the next chips C are mounted along another straight line X3 from left to right. Thus, the chips are mounted along straight lines apart from and parallel to each other, alternately in opposite directions. The above rectilinear path along which the different types of chips C are sequentially mounted in alternately opposite directions on the printed-circuit board, is obtained because the positioning assembly 8 is controlled so that the chips C are positioned along such path and because the solenoids 122 are controlled so that the chips C are supplied by the supply assembly 2 to the transfer assembly 4 in the order in which they are mounted. Of course, the mounting positions on a printed-circuit board need not be orderly arranged along straight lines such as X1, X2 and X3 which are referred to herein only as a typical example of arrangement of the mounting positions wherein positioning distances of the printed-circuit board may be held minimum and the mounting cycle time may be reduced.

The above description has referred to a normal mode of operation of the mounting apparatus without a chucking failure trouble. In the event that a chuck 330 failed to chuck a chip C therein for some reason or other and moved to the component detecting position D without holding the chip C, the lever 512 would be pivoted as previously explained and a chucking failure signal generated from the photomicro sensor 524. In response to this chucking failure signal, the solenoid 548 is energized and the stop member 540 is pivoted to engage the lever 460 whereby the same lever is prevented from further pivoting. Accordingly, the lever 460 can not be pivoted even when the plate cam 478 has been brought by rotation of the drive shaft 314 to the position at which the lever 460 is allowed to pivot counterclockwise as viewed in FIG. 14, whereby the sucker 398 can not be lowered toward the printed-circuit board.

While the chucking failure detector 500 is shown, in FIG. 14, in the middle of the component receiving and loading positions A and B for easy illustration thereof, the detector may actually be located near the component loading position B. In this case, a sucker 398 of the chuck 330 which passed the detecting position D and stopped at the loading position B without holding a chip C would be prevented from lowering in response to generation of a chucking failure signal. Thus, an adhesive deposited on the printed-circuit board is prevented from adhering to the end of the sucker 398 which is otherwise forced against the surface of the board coated with the adhesive. If this chucking failure took place and the sucker 398 of the chuck 330 at the loading position B failed to be lowered, the operation of the entire apparatus would be stopped when the current cycling operation of all parts except the sucker 398 in question had been completed.

While a preferred embodiment of the present invention has been described, such description is for illustrative purpose only, and it is understood that the invention is not limited thereto.

It will be appreciated, for example, that the pallets 198 which are disposed along a straight line in the above embodiment may be disposed along a circle. It is apparent, in this alternative case, that the cartridges 9 are also disposed along a circle. It will also be appreciated that the transfer member need not take a form of pallets and may be an integral rotary disc or equivalents. It is further apparent that the component carrying tape 25 may be an article which consists of a strip member having component storage apertures, and a covering tape covering those apertures. Further, the non-lead electronic components to be handled on the apparatus of this invention are not limited to rectangular chips. They may have cylindrical or other shapes.

It is, of course, possible that the loading and other assemblies may be modified without departing from the spirit and scope of this invention.

For example, it is not absolutely necessary to provide a detecting lever which contacts a part of the outer sleeve 362 in order to monitor for failure of the chucks 330 in holding chips C. Instead of such contact-type lever, noncontact means such as proximity switches may be used, which may detect an abnormal position of the outer sleeve when a chip C is not chucked. The same purpose may be served by air intake or discharge ports provided in place of such proximity switches, which are covered by a part of the outer sleeve 362. With this arrangement, a chucking failure is detected through variation in air pressure sensed at such ports when the outer sleeve is abnormally positioned due to absence of a chip C in the chuck. It is also possible to detect a chucking failure from a position of the inner sleeve 360 itself or from a position of a member which moves with the inner sleeve.

Furthermore, the members to close the chuck jaws 346 and 348 are not limited to such sleeves that contact the outer surfaces of the end portions of those chuck jaws. For example, it is possible to use jaw closing members which contact the inner surfaces of the upper portions of the jaws 346 above the pins 350.

In addition, the device to move the chucks 330 from the component receiving position to the component loading position may provide a linear movement rather than the circular or rotary movement.

It is also noted that the members whose operation is interrupted in response to a chucking failure signal are not limited to the sucker drive unit, and that the actuator to move the stop member may be an air cylinder or other means rather than the solenoid.

What is claimed is:

1. An apparatus for automatically mounting on a workpiece electronic components having no leads, and thereby forming an electronic circuit on the workpiece, which comprises:

a supply assembly including a plurality of tape cartridges disposed on a support means and being equally spaced along a line of transfer of the electronic components, said tape cartridges accommodating a corresponding number of electronic component carrying tapes to store and supply different types of said electronic components, each of said carrying tapes including a strip member which has a multiplicity of longitudinally spaced mutually independent apertures in which said electronic components of a respective type are stored, said apertures being covered with a covering tape disposed over said strip member;

a transfer assembly disposed on said support means including a transfer member having a plurality of grippers disposed along said line of transfer to hold a leading portion of said carrying tapes accommodated in said respective tape cartridges, and further including drive means disposed on said support means and being adapted to move in an intermittent manner said transfer member along said line of transfer for sequential alignment with component supply portions of said plurality of tape cartridges, the distance of each movement of said transfer member being equal to the spacing of said component supply portions;

tape feed assemblies disposed on said support means, said feed assemblies provided adjacent and corresponding to said plurality of tape cartridges, each of said tape feed assemblies being activated when one of said grippers is stopped in alignment with one of said component supply portions of said respective tape cartridges, and thereby feeding in an intermittent manner said carrying tape across said line of transfer with said covering tape facing up, the distance of each feeding movement of said carrying tape being equal to the spacing of said multiplicity of apertures;

covering tape separating assemblies disposed on said support means, said separating assemblies provided adjacent and corresponding to said plurality of tape cartridges, for separating said covering tape from said carrying tape and thereby uncovering at least a leading one of said multiplicity of apertures;

carrying tape severing assemblies, disposed on said support means and between each of said component supply portions of said tape cartridges and said grippers, for cutting off said leading portion of said carrying tape which includes said uncovered leading aperture, and which is held in said grippers, the cut-off leading portion constituting a unit carrying tape;

a loading assembly disposed on said support means, said loading assembly equipped with a pick-up member, for picking up with said pick-up member said component from said uncovered aperture in said unit carrying tape which has been transferred by said transfer member to a specified position, and mounting said component on said workpiece; and a positioning assembly disposed on said support means for establishing desired relative positions between said pick-up member and said workpiece before said component is mounted on the workpiece by said loading assembly.

2. An apparatus according to claim 1, wherein said transfer assembly further includes a guide rail defining said line of transfer, said transfer member comprising a plurality of pallets which are engageable with said guide rail and connected end to end to each other, each of said grippers including one of a plurality of storage grooves which are equally spaced along one side edge of said pallets, said storage grooves extending normal to said one side edge and provided with a width slightly greater than that of said electronic component carrying tapes; and further including an upper retainer jaw for holding with resilient force said unit carrying tape accommodated in said one of storage grooves.

3. An apparatus according to claim 1, wherein each of said tape feed assemblies comprises a sprocket wheel engageable with equally spaced feed holes formed longitudinally in said carrying tape, and further comprises sprocket wheel actuating means for intermittently rotating said sprocket wheel to feed said carrying tape.

4. An apparatus according to claim 3, wherein said tape feed assemblies are driven by a common drive member through relay members provided corresponding to said tape feed assemblies, each of said relay members being movable between a first position thereof where the same transmits an output force of said common drive member to said tape feed assemblies and a second position thereof where the same does not transmit the output force.

5. An apparatus according to claim 1, wherein each of said tape feed assemblies comprises a guide having a guiding channel for longitudinally guiding said carrying tape to said component supply portion, and a tape retainer for covering said guiding channel to prevent said carrying tape from being dislocated out of said guiding channel, each of said covering tape separating assemblies comprising a take-up reel positioned above and at the rear of the tip of said tape retainer adjacent to said carrying tape severing assembly, said take-up reel cooperating with said tip to separate said covering tape, said covering tape being wound on said take-up reel while being turned over along said tip of said tape retainer when said carrying tape is fed, whereby the covering tape is separated from said leading portion of the carrying tape.

6. An apparatus according to claim 1, wherein said carrying tape severing assemblies comprise movable blades which correspond to said tape feed assemblies and are lowered and lifted by actuating means, and at least one stationary blade cooperating with plural ones of said movable blades to sever said carrying tape.

7. An apparatus according to claim 1, wherein said pick-up member comprises a sucker member to suck up said component through vacuum.

8. An apparatus according to claim 2 further comprising a tape disposal assembly including a rotary brush rotated for sweeping out of said storage grooves said unit carrying tapes from which said components have been picked up.

9. An apparatus according to claim 1, wherein said loading assembly has a chuck comprising:

a chuck body;

a sucker member axially slidably fitted in said chuck body and lowered and lifted for functioning as said pick-up member to suck up said component through vacuum;

at least a pair of chuck jaws pivoted on said chuck body;

first resilient means for biasing said chuck jaws in opening direction;

a sleeve slidably fitted on said chuck body;

second resilient means for biasing downward said sleeve to make the same engage said chuck jaws for closing them, said chuck jaws chucking said component sucked up by said sucker member.

10. An apparatus according to claim 9 further comprising a chucking failure detecting assembly to monitor lowering of said sleeve beyond a predetermined limit when said sucker member has failed to suck up said component.

* * * * *